(12) United States Patent
Zhan et al.

(10) Patent No.: US 12,125,859 B2
(45) Date of Patent: Oct. 22, 2024

(54) DETECTION SUBSTRATE AND FLAT PANEL DETECTOR

(71) Applicants: Beijing BOE Sensor Technology Co., Ltd., Beijing (CN); BOE TECHNOLOGY GROUP CO., LTD., Beijing (CN)

(72) Inventors: Xiangmi Zhan, Beijing (CN); Zhenyu Wang, Beijing (CN); Yifan Yang, Beijing (CN); Zhi Ding, Beijing (CN); Xuecheng Hou, Beijing (CN)

(73) Assignees: Beijing BOE Sensor Technology Co., Ltd., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/908,418

(22) PCT Filed: Aug. 31, 2021

(86) PCT No.: PCT/CN2021/115488
§ 371 (c)(1),
(2) Date: Aug. 31, 2022

(87) PCT Pub. No.: WO2023/028796
PCT Pub. Date: Mar. 9, 2023

(65) Prior Publication Data
US 2024/0194705 A1    Jun. 13, 2024

(51) Int. Cl.
*H01L 27/146* (2006.01)
*G01T 1/20* (2006.01)

(52) U.S. Cl.
CPC ...... *H01L 27/14616* (2013.01); *G01T 1/2018* (2013.01); *H01L 27/14636* (2013.01);
(Continued)

(58) Field of Classification Search
CPC ......... H01L 27/14616; H01L 27/14636; H01L 27/14659; H01L 27/14689; H01L 27/14692; G01T 1/2018
See application file for complete search history.

(56) References Cited

U.S. PATENT DOCUMENTS 10,726,237 B2    7/2020 Liang et al.
2019/0044007 A1    2/2019 Sun et al.
(Continued)

FOREIGN PATENT DOCUMENTS

CN    106935601 A    7/2017
CN    108321152 A    7/2018
(Continued)

OTHER PUBLICATIONS

Marrs et al., Substrate and Passivation Techniques for Flexible Amorphous Silicon-Based X-ray Detectors, Sensors, vol. 16, No. 1162, 14 pages. (Year: 2016).*

*Primary Examiner* — Kiho Kim
(74) *Attorney, Agent, or Firm* — HOUTTEMAN LAW LLC

(57) ABSTRACT

The present disclosure provides a detection substrate, including: a base substrate, detection pixel units arranged in an array on the base substrate, where each detection pixel unit includes: a thin film transistor and a photoelectric conversion part located on a side of the thin film transistor, and a bias voltage line is arranged on a side of the photoelectric conversion part. The thin film transistor includes: an active layer, a first electrode and a second electrode, and the active layer including a channel region. At least one dielectric layer is provided between the photoelectric conversion part and the bias voltage line, and is formed with a first via hole therein, and at least part of an orthographic projection of the channel region on the base substrate is located within (Continued)

an orthographic projection of the first via hole on the base substrate. A flat panel detector is further provided.

20 Claims, 23 Drawing Sheets

(52) U.S. Cl.
CPC .. *H01L 27/14659* (2013.01); *H01L 27/14689* (2013.01); *H01L 27/14692* (2013.01)

(56) References Cited

U.S. PATENT DOCUMENTS

| | | | |
|---|---|---|---|
| 2019/0165008 A1* | 5/2019 | Lee | ................... H01L 27/1225 |
| 2020/0135796 A1 | 4/2020 | Kim et al. | |
| 2022/0310683 A1 | 9/2022 | Hou et al. | |

FOREIGN PATENT DOCUMENTS

| | | |
|---|---|---|
| CN | 109166943 A | 1/2019 |
| CN | 111129045 A | 5/2020 |
| CN | 111244119 A | 6/2020 |

\* cited by examiner

DETECTION SUBSTRATE AND FLAT PANEL DETECTOR

TECHNICAL FIELD

The present disclosure relates to the field of photoelectric detection technology, and in particular, to a detection substrate and a flat panel detector.

BACKGROUND

With the continuous development of X-ray digital imaging technology, a Flat Panel X-ray Detector (FPXD) may be used to directly convert an X-ray image into a digital image, and has a wide application prospect in the fields of medical treatment, security protection, industrial detection and the like.

The flat panel X-ray detector includes a detection substrate, which is provided with a plurality of thin film transistors (TFTs) and a plurality of photodiodes (PIN). At present, the thin film transistors mostly are amorphous silicon (a-Si) thin film transistors, but carrier mobility of the amorphous silicon thin film transistors is low, which can not meet dynamic requirements of the flat panel X-ray detector. The carrier mobility of an Indium Gallium Zinc Oxide (IGZO) thin film transistor ranges from 5 to 20, which can meet the requirements of application scenes.

However, IGZO is a metal oxide and is very sensitive to hydrogen atoms (H Plasma) having high reducibility. Thus, when a relevant film layer (e.g., a silicon nitride layer) and the photodiode are fabricated, hydrogen atoms may diffuse toward the IGZO thin film transistor; the permeation of excess H atoms into a-IGZO active layer may have a great influence on characteristics of the TFT. Under X-ray irradiation, the hydrogen atoms in IGZO may be promoted to be transformed into a shallow donor state, and an increase of hydrogen shallow donors will cause a conductivity of the TFT to increase, a leakage current to increase and a characteristic curve of the TFT to be biased to left, so that the stability of the TFT is poor, and a performance of the flat panel detector is influenced.

SUMMARY

In a first aspect, an embodiment of the present disclosure provides a detection substrate, which includes: a base substrate, a plurality of detection pixel units arranged in an array on the base substrate, where each detection pixel unit includes: a thin film transistor and a photoelectric conversion part located on a side, away from the base substrate, of the thin film transistor, and a bias voltage line is arranged on a side, away from the base substrate, of the photoelectric conversion part;

the thin film transistor includes: an active layer, a first electrode and a second electrode, both the first electrode and the second electrode being electrically connected to the active layer, and the active layer including a channel region;

an end of the photoelectric conversion part close to the base substrate is electrically connected with the second electrode, and an end of the photoelectric conversion part away from the base substrate is electrically connected with the bias voltage line corresponding thereto;

at least one dielectric layer is provided between the photoelectric conversion part and the bias voltage line, the dielectric layer is formed with a first via hole therein, and at least part of an orthographic projection of the channel region on the base substrate is located within an orthographic projection of the first via hole on the base substrate In some implementations, the orthographic projection of the channel region on the base substrate is located within the orthographic projection of the first via hole on the base substrate.

In some implementations, the at least one dielectric layer includes a second organic layer.

In some implementations, the at least one dielectric layer further includes:
  a buffer layer located between the second organic layer and the photoelectric conversion part; and/or
  a fourth passivation layer located between the second organic layer and the bias voltage line.

In some implementations, a third via hole communicating to an end of the photoelectric conversion part away from the base substrate is formed in the dielectric layer, and the bias voltage line is in contact with the end of the photoelectric conversion part, corresponding to the bias voltage line, away from the base substrate through the third via hole corresponding to the bias voltage line.

In some implementations, the orthographic projection of the channel region on the base substrate and an orthographic projection of the photoelectric conversion part on the base substrate are not overlapped with each other.

In some implementations, the photoelectric conversion part includes a reading electrode and a photoelectric conversion structure, the photoelectric conversion structure being located on a side of the reading electrode away from the base substrate, a material of the reading electrode including a metal material;
  an orthographic projection of a layer structure where the reading electrode is located on the base substrate is not overlapped with the orthographic projection of the channel region on the base substrate.

In some implementations, the orthographic projection of the channel region on the base substrate is located within an orthographic projection of the bias voltage line on the base substrate, a material of the bias voltage line including a metal material.

In some implementations, the orthographic projection of the channel region on the base substrate is located within the orthographic projection of the photoelectric conversion part on the base substrate.

In some implementations, the first via hole and the third via hole are a same via hole.

In some implementations, a material of the bias voltage line includes a transparent conductive material.

In some implementations, the detection pixel unit further includes:
  a sacrificial layer located between the thin film transistor and the photoelectric conversion part, a material of the sacrificial layer including an oxide;
  at least part of the orthographic projection of the channel region on the base substrate is located within an orthographic projection of the sacrificial layer on the base substrate.

In some implementations, the sacrificial layer is in contact with an end of the photoelectric conversion part close to the base substrate, and sacrificial layers in different detection pixel units are insulated from each other.

In some implementations, the orthographic projection of the channel region on the base substrate and the orthographic projection of the photoelectric conversion part on the base substrate are not overlapped with each other;

a third passivation layer is provided between the sacrificial layer and the bias voltage line; and the orthographic projection of the first via hole on the base substrate is located within an orthographic projection of the third passivation layer on the base substrate.

In some implementations, the at least one dielectric layer includes a second organic layer, a buffer layer, and a fourth passivation layer;

a compactness of the third passivation layer is smaller than that of the buffer layer, and the compactness of the third passivation layer is smaller than that of the fourth passivation layer.

In some implementations, a material of the third passivation layer includes silicon oxide, a material of the buffer layer includes silicon nitride, and a material of the fourth passivation layer includes silicon nitride.

In some implementations, a first passivation layer, a first organic layer, and a second passivation layer are further provided between the thin film transistor and the photoelectric conversion part, the first organic layer being located on a side of the first passivation layer away from the base substrate, the second passivation layer being located on a side of the first organic layer away from the base substrate;

the sacrificial layer is located between the second passivation layer and the photoelectric conversion part.

In some implementations, a second via hole communicating to the second electrode is formed in the first passivation layer, the first organic layer and the second passivation layer;

the photoelectric conversion part includes a reading electrode and a photoelectric conversion structure, and the photoelectric conversion structure being located on a side of the reading electrode away from the base substrate;

the reading electrode is in contact with the second electrode through the second via hole, and the sacrificial layer is not in contact with the second electrode.

In some implementations, the orthographic projection of the sacrificial layer on the base substrate and an orthographic projection of the second via hole on the base substrate are not overlapped with each other or are partially overlapped with each other.

In some implementations, at least part of a boundary of an orthographic projection of the reading electrode on the base substrate is located within a boundary of the orthographic projection of the sacrificial layer on the base substrate.

In some implementations, the orthographic projection of the photoelectric conversion structure on the base substrate is not overlapped with the orthographic projection of the second via hole on the base substrate.

In some implementations, a boundary of an orthographic projection of the photoelectric conversion structure on the base substrate is located within a boundary of an orthographic projection of the reading electrode on the base substrate.

In some implementations, a first passivation layer, a first organic layer and a second passivation layer are further provided between the thin film transistor and the photoelectric conversion part, the first organic layer being located on a side of the first passivation layer away from the base substrate, and the second passivation layer being located on a side of the first organic layer away from the base substrate;

the sacrificial layer is located between the first passivation layer and the first organic layer;

or, the sacrificial layer is located between the first organic layer and the second passivation layer.

In some implementations, a material of the first passivation layer includes silicon oxide, and a material of the second passivation layer includes silicon oxide.

In some implementations, the orthographic projection of the channel region on the base substrate is located within the orthographic projection of the sacrificial layer on the base substrate.

In some implementations, the detection substrate further includes: a plurality of gate lines arranged in a first direction and a plurality of signal reading lines arranged in a second direction, the gate lines each extending in the second direction, the signal reading lines each extending in the first direction;

the thin film transistor further includes a gate electrode which is electrically connected with one of the gate lines corresponding thereto;

the second electrode of the transistor is electrically connected to one of the signal reading lines corresponding thereto.

In some implementations, each detection pixel unit includes a sacrificial layer, an orthographic projection of the sacrificial layer on the base substrate is not overlapped with an orthographic projection of the gate line on the base substrate, and the orthographic projection of the sacrificial layer on the base substrate is not overlapped with an orthographic projection of the signal reading line on the base substrate.

In some implementations, the sacrificial layer includes: a first portion and a second portion which are connected with each other, a part of the first portion close to the gate line or the signal reading line protruding from the second portion;

a line width of a part of the signal reading line close to the first portion is smaller than a line width of a part of the signal reading line close to the second portion, and a line width of a part of the gate line close to the first portion is smaller than a line width of a part of the gate line close to the second portion.

In some implementations, the second electrode includes: a first conductive portion for connecting with the active layer, a second conductive portion for connecting with an end, close to the base substrate, of the photoelectric conversion part, and a third conductive portion connecting the first conductive portion with the second conductive portion, where the third conductive portion is located between the first conductive portion and the second conductive portion;

a side edge of the first conductive portion away from the gate line and a side edge of the second conductive portion away from the gate line each extend along the second direction;

a distance from the side edge of the first conductive portion away from the gate line to the gate line is larger than a distance from the side edge of the second conductive portion away from the gate line to the gate line.

In some implementations, the third conductive portion includes: a first connecting part connected to the first conductive portion, a second connecting part connected to the second conductive portion, and a third connecting part connecting the first connecting part with the second connecting part, the third connecting part being located between the first connecting part and the second connecting part;

the first connecting part extends along the second direction, and a side edge of the first connecting part away from the gate line and a side edge of the first conductive portion, which is connected to the first connecting part, away from the gate line, are located on a same straight line;

the second connecting part extends along the second direction, and a side edge of the second connecting part away from the gate line and a side edge of the second conductive portion, which is connected with the second connecting part, away from the gate line, are located on a same straight line;

a direction in which the third connecting part extends intersects with the second direction.

In some implementations, the gate electrode includes: a body portion and a fourth connecting part connected with the body portion, the fourth connecting part being in contact with the gate line corresponding thereto;

a width of the fourth connecting part in the second direction is larger than a width of the body portion in the second direction.

In some implementations, a width of the fourth connecting part in the second direction gradually decreases in a direction from the fourth connecting part towards the body portion.

In some implementations, the detection substrate further includes:

a fifth passivation layer located on a side of the bias voltage line away from the base substrate; and a third organic layer located on a side of the fifth passivation layer away from the base substrate.

In a second aspect, an embodiment of the present disclosure further provides a flat panel detector, which includes the detection substrate as provided in the first aspect.

DRAWINGS

DETAILED DESCRIPTION

Figure 1:
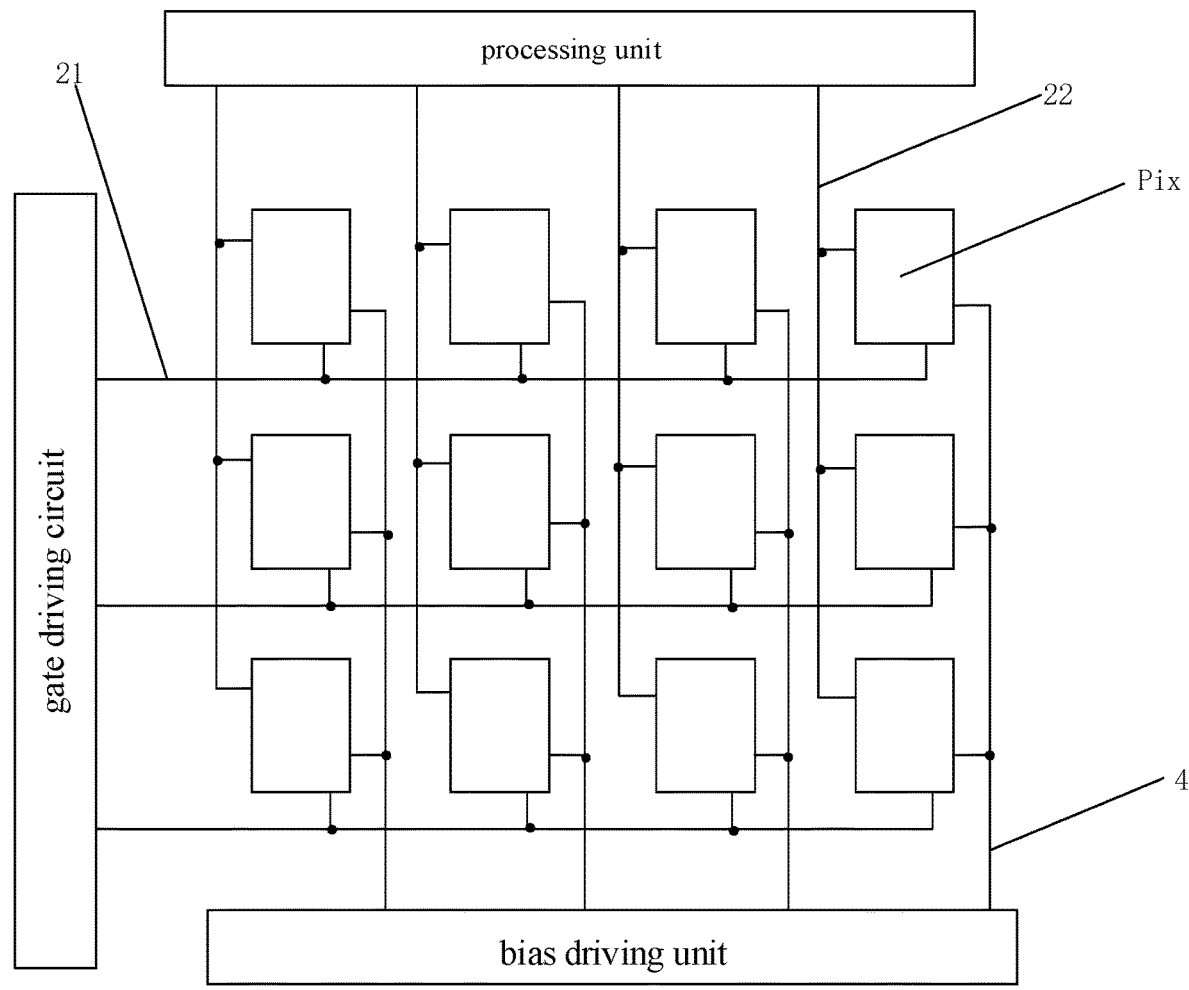
FIG. 1 is a schematic structural diagram of a detection substrate according to an embodiment of the present disclosure.

Technical solutions in embodiments of the present disclosure will be clearly and completely described below with reference to drawings, and it is obvious that the described embodiments are only a part of embodiments of the present disclosure, but not all of embodiments of the present disclosure. All other embodiments, which can be obtained by a person skilled in the art without making any creative effort based on the disclosed embodiments, belong to the protection scope of the present disclosure.

In the embodiments of the present disclosure, wordings "first", "second", and the like are used for distinguishing the same or similar items with substantially the same functions and actions, and are used only for clearly describing technical solutions of the embodiments of the present disclosure, but should not be understood as indicating or implying relative importance or implicitly indicating the number of indicated technical features.

In the embodiments of the present disclosure, unless otherwise specifically limited, "a plurality of" means two or more.

In the embodiments of the present disclosure, the terms "upper/on", "lower/below", and the like indicate orientations or positional relationships based on orientations or positional relationships shown in the drawings, which are merely for convenience of describing the present disclosure and simplifying the description, but do not indicate or imply that devices or elements referred to must have a specific orientation, be constructed and operated in a specific orientation, and thus, should not be construed as limiting the present disclosure.

Figure 2:
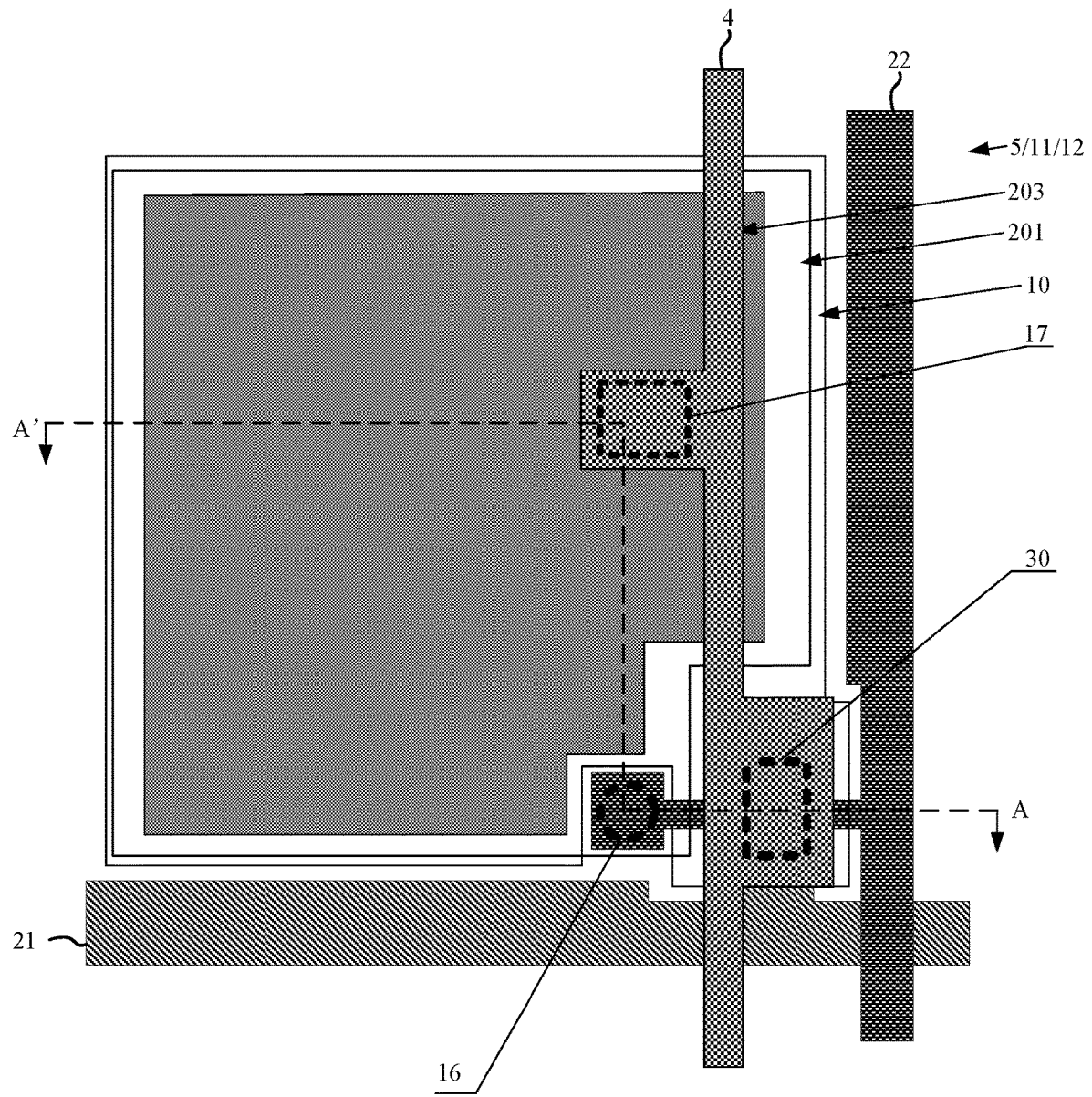
FIG. 2 is a schematic structural diagram of a region where a detection pixel unit is located according to an embodiment of the present disclosure.
Figure 3A:
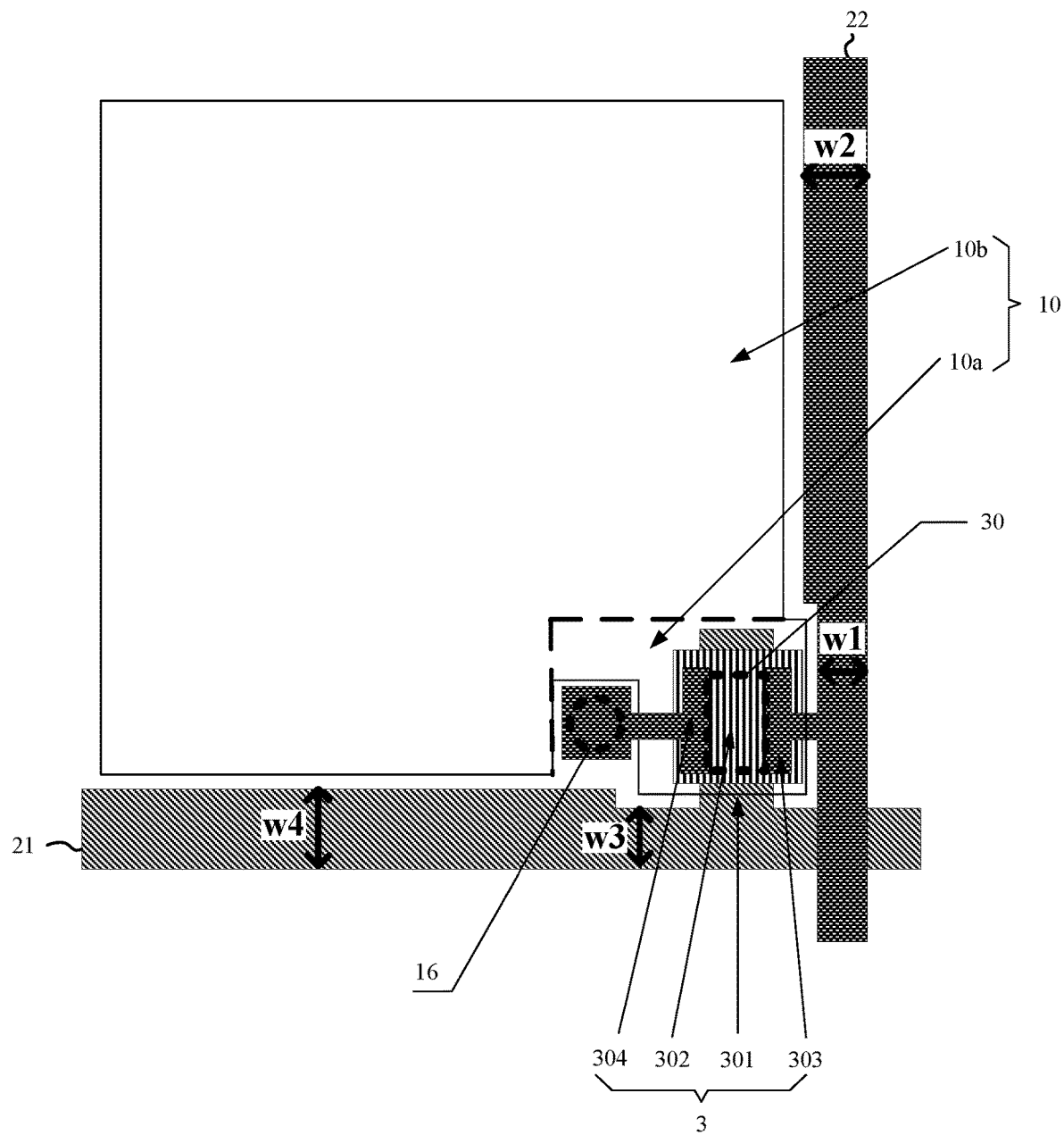
FIG. 3a is a schematic diagram of a structure of FIG. 2 in which a sacrificial layer is formed on a side of a thin film transistor away from a base substrate.
Figure 3B:
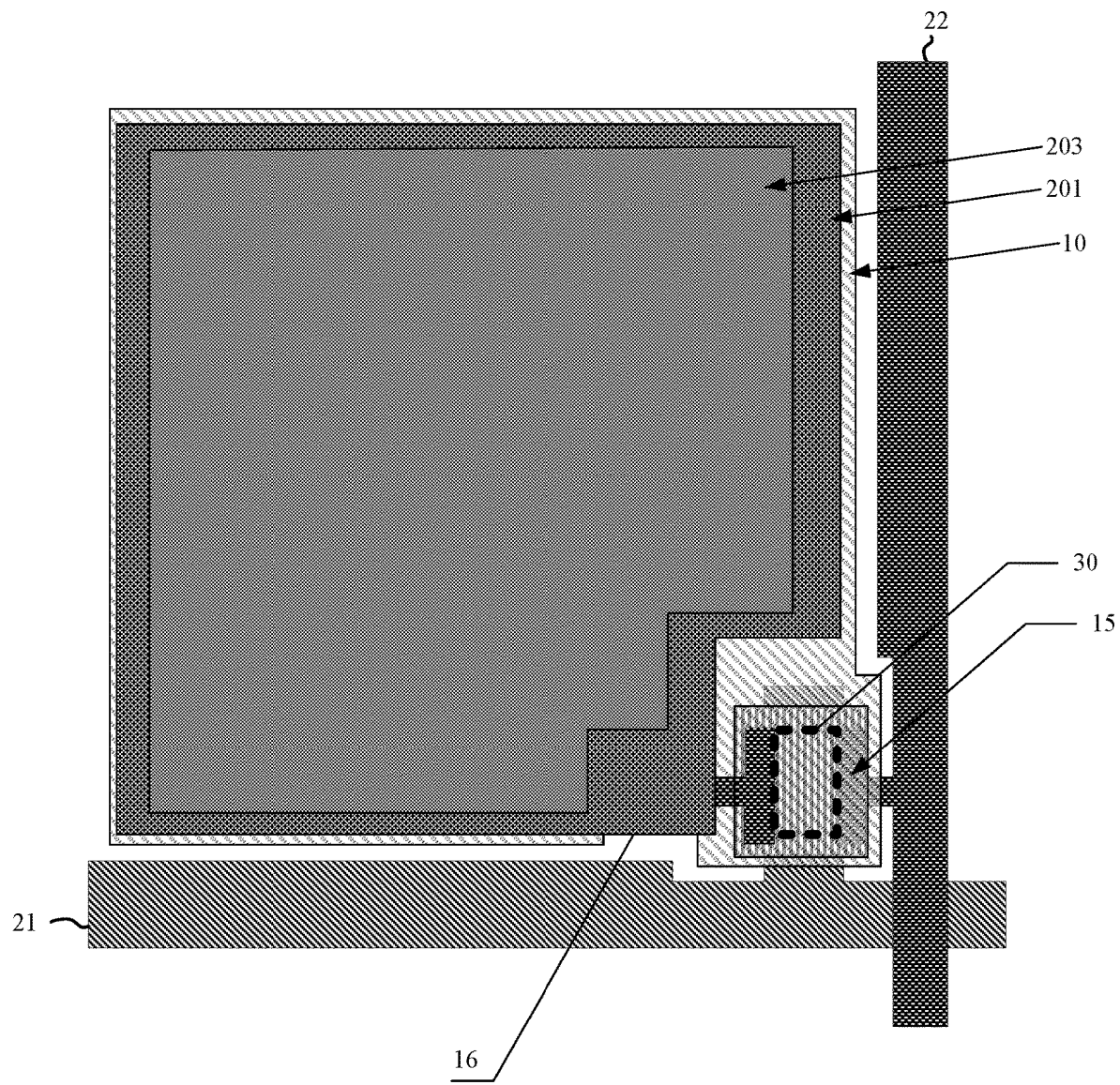
FIG. 3b is a schematic diagram of a structure of FIG. 2 in which a third passivation layer is formed on a side of a photoelectric conversion part away from the base substrate.
Figure 3C:
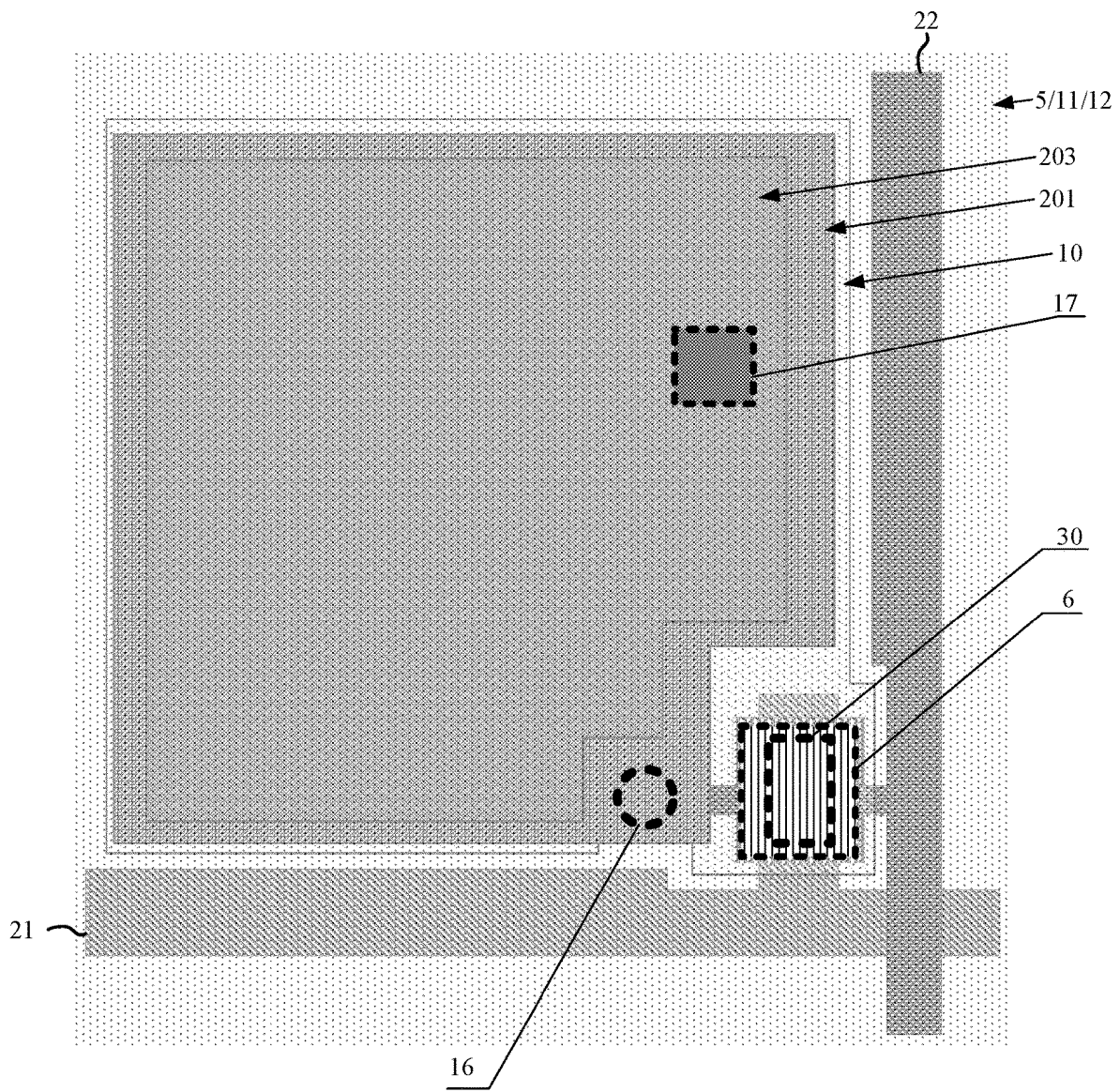
FIG. 3c is a schematic diagram of a structure in which a dielectric layer is formed on a side of the third passivation layer away from the base substrate.
Figure 4:
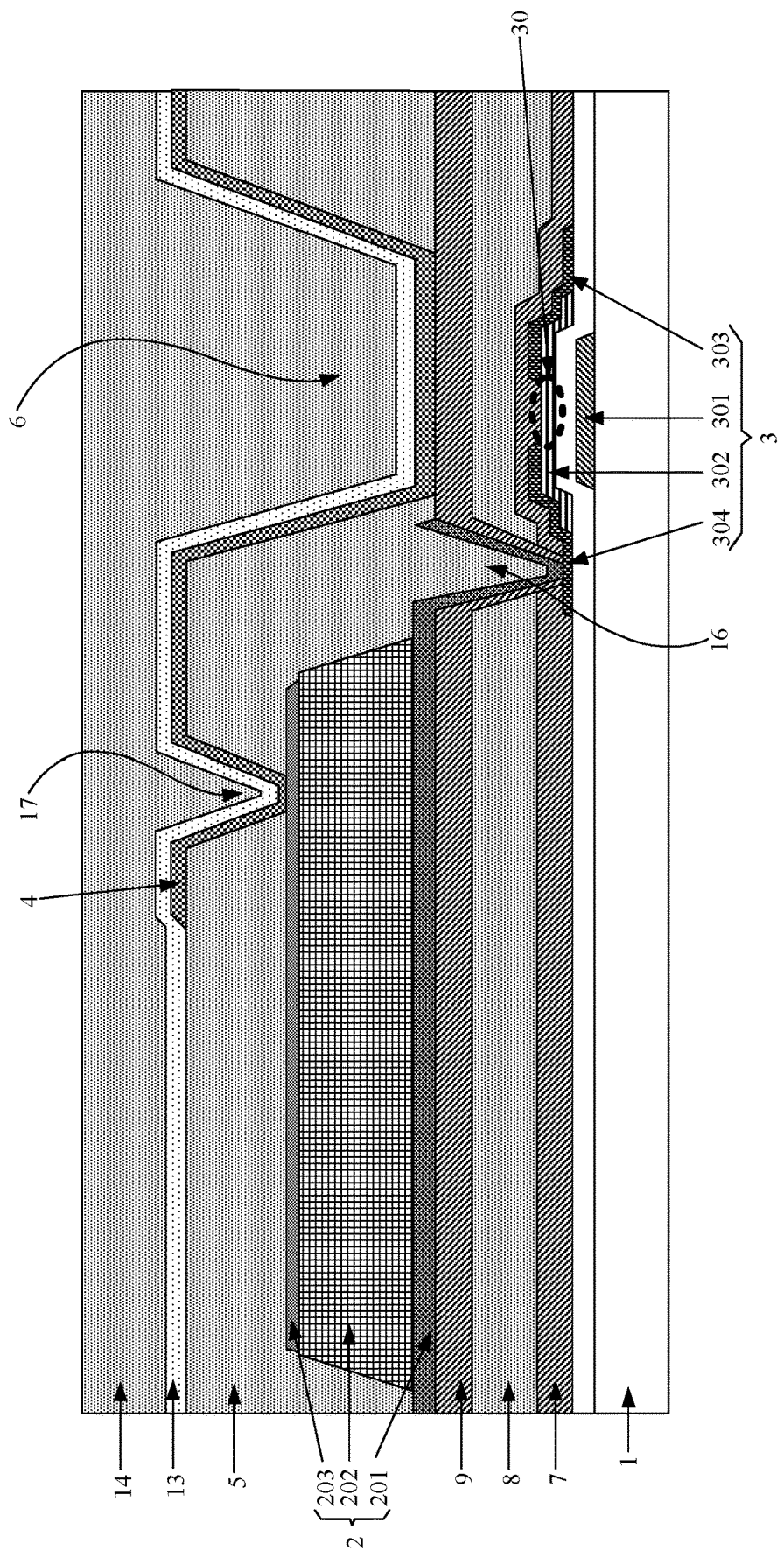
FIG. 4 is a schematic cross-sectional view taken along line A-A' of FIG. 2.

FIG. 1 is a schematic structural diagram of a detection substrate according to an embodiment of the present disclosure, FIG. 2 is a schematic structural diagram of a region where a detection pixel unit is located according to an embodiment of the present disclosure, FIG. 3a is a schematic diagram of a structure of FIG. 2 in which a sacrificial layer is formed on a side of a thin film transistor away from a base substrate, FIG. 3b is a schematic diagram of a structure of FIG. 2 in which a third passivation layer is formed on a side of a photoelectric conversion part away from the base substrate; FIG. 3c is a schematic diagram of a structure in which a dielectric layer is formed on a side of the third passivation layer away from the base substrate; and FIG. 4 is a schematic cross-sectional view taken along line A-A' of FIG. 2, as shown in FIGS. 1 to 4, the detection substrate includes: a base substrate 1 and a plurality of detection pixel units Pix which are arranged in an array on the base substrate 1.

Each detection pixel unit Pix includes: a thin film transistor 3 and a photoelectric conversion part 2 located on a side of the thin film transistor 3 away from the base substrate 1, and a bias voltage line 4 is provided on a side of the photoelectric conversion part 2 away from the base substrate 1.

The thin film transistor 3 includes: an active layer 302, a first electrode 303 and a second electrode 304, where the active layer 302 includes a channel region 30 and electrode contact regions positioned at two sides of the channel region 30, and the first electrode 303 and the second electrode 304 are respectively in contact with the electrode contact regions positioned at two sides of the channel region 30 so as to realize electric connection with the active layer 302.

An end of the photoelectric conversion part 2 close to the base substrate 1 is electrically connected to the second electrode 304, and another end of the photoelectric conversion part 2 away from the base substrate 1 is electrically connected to the bias voltage line 4 corresponding thereto.

At least one dielectric layer is arranged between the photoelectric conversion part 2 and the bias voltage line 4, a first via hole 6 is formed in the dielectric layer, and at least part of an orthographic projection of the channel region 30 on the base substrate 1 is located within an orthographic projection of the first via hole 6 on the base substrate 1; that is, the first via hole 6 and the channel region 30 are overlapped with each other in a direction perpendicular to the base substrate 1.

In the embodiment of the present disclosure, the first via hole 6 is disposed in the at least one dielectric layer above the channel region 30 of the thin film transistor 3, and the first via hole 6 and the channel region 30 are overlapped with each other in the direction perpendicular to the base substrate 1, based on such pixel design, it is beneficial to releasing hydrogen atoms from the channel region 30 in later processes such as a high temperature annealing, that is, a content of hydrogen atoms in the channel region 30 can be effectively reduced, so as to effectively reduce the conductivity of the thin film transistor 3 being turned off, and thus prevent the channel region 30 from becoming a conductor, and enhance the stability of the thin film transistor 3.

In some implementations, the orthographic projection of the channel region 30 on the base substrate 1 is located within the orthographic projection of the first via hole 6 on the base substrate 1; that is, the orthographic projection of the first via hole 6 on the base substrate 1 may completely cover the orthographic projection of the channel region 30 on the base substrate 1, which is favorable for releasing hydrogen atoms from the channel region 30.

In the embodiment of the present disclosure, a material of the base substrate 1 is not limited, and the material of the base substrate 1 may include a rigid material such as glass; alternatively, the material of the base substrate 1 may also include a flexible material, such as, polyimide (PI).

In the thin film transistor 3, the first electrode 303 and the second electrode 304 may be a drain electrode and a source electrode, respectively, and their functions may be interchanged according to the type of the thin film transistor 3 and a signal input thereto, and thus are not specifically distinguished herein. For example, in a case where the thin film transistor 3 is an N-type thin film transistor 3, the first electrode 303 may be the drain electrode, and the second electrode 304 may be the source electrode. In a case where the thin film transistor 3 is a P-type thin film transistor 3, the first electrode 303 may be the source electrode and the second electrode 304 may be the drain electrode.

The thin film transistor 3 may further include a gate electrode 301; the thin film transistor 3 may be a bottom gate type thin film transistor 3 (the gate electrode 301 is located on a side of the active layer 302 close to the base substrate 1) as shown in FIG. 4, or may also be a top gate type thin film transistor 3 (the gate electrode 301 is located on the side of the active layer 302 away from the base substrate 1, which is not shown in the drawings), which is not limited herein. It should be noted that, because the gate electrode 301 of the top gate type thin film transistor 3 is located above the channel region 30, the gate electrode 301 will block movement of the hydrogen atoms from the channel region 30 towards the first via hole 6 to a certain extent, which is not favorable for releasing the hydrogen atoms from the channel region 30, therefore, the bottom gate type thin film transistor 3 is desired to be employed in the present disclosure.

In the embodiment of the present disclosure, the materials of the first electrode 303, the second electrode 304 and the gate electrode 301 of the thin film transistor 3 may include metals such as molybdenum, aluminum, silver, copper, titanium, platinum, tungsten, etc., and may also include other conductive materials such as metal alloys, which may be selected as required.

In the embodiment of the present disclosure, the active layer 302 of the thin film transistor 3 may be made of a metal oxide semiconductor material, and the metal oxide thin film transistor 3 has the characteristics of high carrier mobility, fast switching speed, and the like, and is suitable for the detection substrate. In some implementations, the material of the active layer 302 includes at least one of Indium Gallium Zinc Oxide (IGZO), Indium Tin Zinc Oxide (ITZO), Indium Gallium Tin Oxide (GITO), or Indium Gallium Zinc Tin Oxide (IGTO).

In the embodiment of the present disclosure, the photoelectric conversion part 2 can convert light energy into electric energy, and a specific structure of the photoelectric conversion part 2 is not limited. Referring to FIG. 4, in some implementations, the photoelectric conversion part 2 may include a reading electrode 201, a photoelectric conversion structure 202, and a conductive electrode 203, the conductive electrode 203 is located on a side of the reading electrode 201 away from the base substrate 1, and the photoelectric conversion structure 202 is located between the reading electrode 201 and the conductive electrode 203.

In the present disclosure, the photoelectric conversion part 2 may be a PIN photodiode. The photoelectric conversion structure 202 may include a first doped layer, an intrinsic layer, and a second doped layer sequentially stacked on the reading electrode 201, the first doped layer and the second doped layer having opposite polarities; the first doped layer contacts the reading electrode 201, and the second doped layer 152 contacts the conductive electrode 203.

The first doped layer and the second doped layer may include N-type impurities or P-type impurities, respectively. The intrinsic layer does not include impurities. A thickness of the intrinsic layer may be greater than each of thicknesses of the first doped layer and the second doped layer.

If the first doped layer includes N-type impurities, and the second doped layer includes P-type impurities, the first doped layer is an N-type semiconductor layer and the second doped layer is a P-type semiconductor layer, in such case, a negative bias voltage may be input into the second doped layer through a bias electrode and the conductive electrode 203. If the first doped layer includes P-type impurities, and the second doped layer includes N-type impurities, the first doped layer is a P-type semiconductor layer and the second doped layer is an N-type semiconductor layer, in such case, a positive bias voltage may be input into the second doped layer through the bias electrode and the conductive electrode 203.

In some implementations, the conductive electrode 203 is a transparent electrode, and may be made of a transparent metal oxide such as Indium Tin Oxide (ITO), Indium Zinc Oxide (IZO), Gallium Zinc Oxide (GZO), or the like. The reading electrode 201 is a metal electrode, and is made of a metal material such as copper (Cu), aluminum (Al), titanium (Ti) or an alloy material.

Referring to FIGS. 2, 3b, and 3c, in some implementations, the orthographic projection of the channel region 30 on the base substrate 1 and an orthographic projection of the photoelectric conversion part 2 on the base substrate 1 are not overlapped with each other. That is, the photoelectric conversion part 2 does not includes a part located directly above the channel region, and with such design, the amount of hydrogen atoms diffused to the channel portion during the process of manufacturing the photoelectric conversion part 2 can be effectively reduced.

In some implementations, a material of the reading electrode 201 includes a metal material, an orthographic projection of a layer structure where the reading electrode 201 is located on the base substrate 1 is not overlapped with the orthographic projection of the channel region 30 on the base substrate 1; with such design, an adverse effect of the reading electrode 201 on the process of the channel region 30 releasing the hydrogen atoms through the first via hole 6 can be effectively avoided.

Since the orthographic projection of the layer structure where the reading electrode 201 is located on the base substrate 1 is not overlapped with the orthographic projection of the channel region 30 on the base substrate 1, that is, the reading electrode does not cover the channel region 30, in such case, external light can irradiate the channel region 30, so that the electrical characteristics of the thin film transistor 3 are shifted. To solve this problem, in some implementations, a material of the bias voltage line 4 includes a metal material, and the orthographic projection of the channel region 30 on the base substrate 1 is located within an orthographic projection of the bias voltage line 4 on the base substrate 1. That is to say, a portion of the bias voltage line 4 covering the channel region 30 can block light from irradiating the channel region 30, so as to avoid the problem that the electrical characteristics of the thin film transistor 3 are shifted due to the light irradiating the channel region 30 of the thin film transistor 3.

The detection substrate provided by the embodiment of the present disclosure may be applied to a flat panel X-ray detector, and the flat panel X-ray detector may be a direct conversion type (e.g., Direct digital radiography, Direct DR) detector, or may also be an indirect conversion type (e.g., Indirect digital radiography, Indirect DR) detector, which is not limited herein. The indirect conversion type flat panel X-ray detector has the advantages of mature technology, relatively low cost, high Detective Quantum Efficiency (DQE) and good reliability, and thus has been widely developed and applied. A display principle of the indirect conversion type flat panel X-ray detector is as follows: under the irradiation of X-rays, a scintillator layer or a phosphor layer of the indirect conversion type flat panel X-ray detector converts X-ray photons into visible light, then the visible light is converted into electrical signals by the photoelectric conversion part 2, and the electrical signals are finally read and output through the thin film transistor 3 to obtain a display image.

Certainly, the above-mentioned detection substrate may also be applied to other products using the metal oxide thin film transistor 3. After the metal oxide thin film transistor 3 of the product is manufactured, sensitization environments such as high hydrogen, high water, high oxygen and the like exist in subsequent processes, and the detection substrate may be adopted to protect the metal oxide thin film transistor 3 as much as possible and prevent the metal oxide thin film transistor 3 from being reduced or restored, so as to improve the stability of the metal oxide thin film transistor 3.

With continued reference to FIG. 4, in some implementations, the at least one dielectric layer includes a second organic layer 5. The second organic layer 5 plays roles of insulation and flatness, so as to facilitate the manufacturing of subsequent film layers. The second organic layer 5 is formed with the first via hole 6 as described above therein for the channel region 30 releasing hydrogen atoms. In some implementations, a material of the second organic layer 5 may include organic resin materials such as polyacrylic resin, polyepoxy acrylic resin, polyester acrylate, urethane acrylate resin, and the like.

Figure 5:
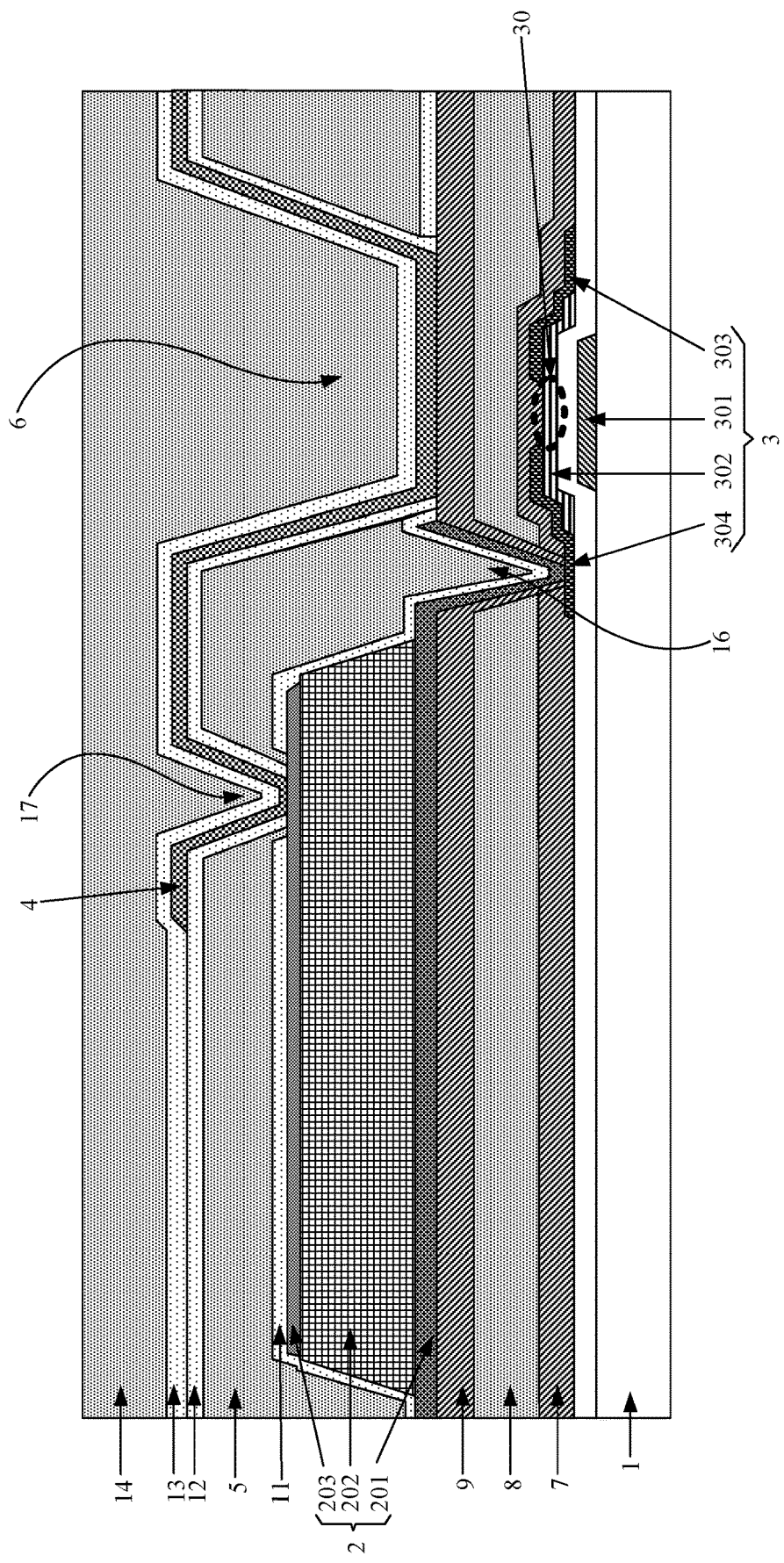
FIG. 5 is another schematic cross-sectional view taken along line A-A' of FIG. 2.

FIG. 5 is another schematic cross-sectional view taken along line A-A' of FIG. 2, and as shown in FIG. 5, in some implementations, the dielectric layer between the photoelectric conversion part 2 and the bias voltage line 4 includes not only the second organic layer 5 but also at least one of a buffer layer 11 and a fourth passivation layer 12 (FIG. 5 exemplarily illustrates a case where both the buffer layer 11 and the fourth passivation layer 12 are included). The buffer layer 11 is located between the second organic layer 5 and the photoelectric conversion part 2; the fourth passivation layer 12 is located between the second organic layer 5 and the bias voltage line 4. The buffer layer 11 covers the photoelectric conversion part 2, and plays roles of protection and insulation, and meanwhile, the buffer layer 11 also plays a role of enhancing the bonding firmness between the second organic layer 5 to be formed subsequently and a film layer below the buffer layer. The fourth passivation layer 12 covers the second organic layer 5 and plays roles of protection and insulation, and the fourth passivation layer 12 may also play a role of enhancing the bonding firmness between the bias voltage line 4 to be formed subsequently and a film layer below the fourth passivation layer. The buffer layer 11 and the fourth passivation layer 12 are formed with the first via hole 6 as described above therein for the channel region 30 releasing hydrogen atoms. In some implementations, a material of the buffer layer 11 includes silicon nitride, and a material of the fourth passivation layer 12 includes silicon nitride.

Figure 6:
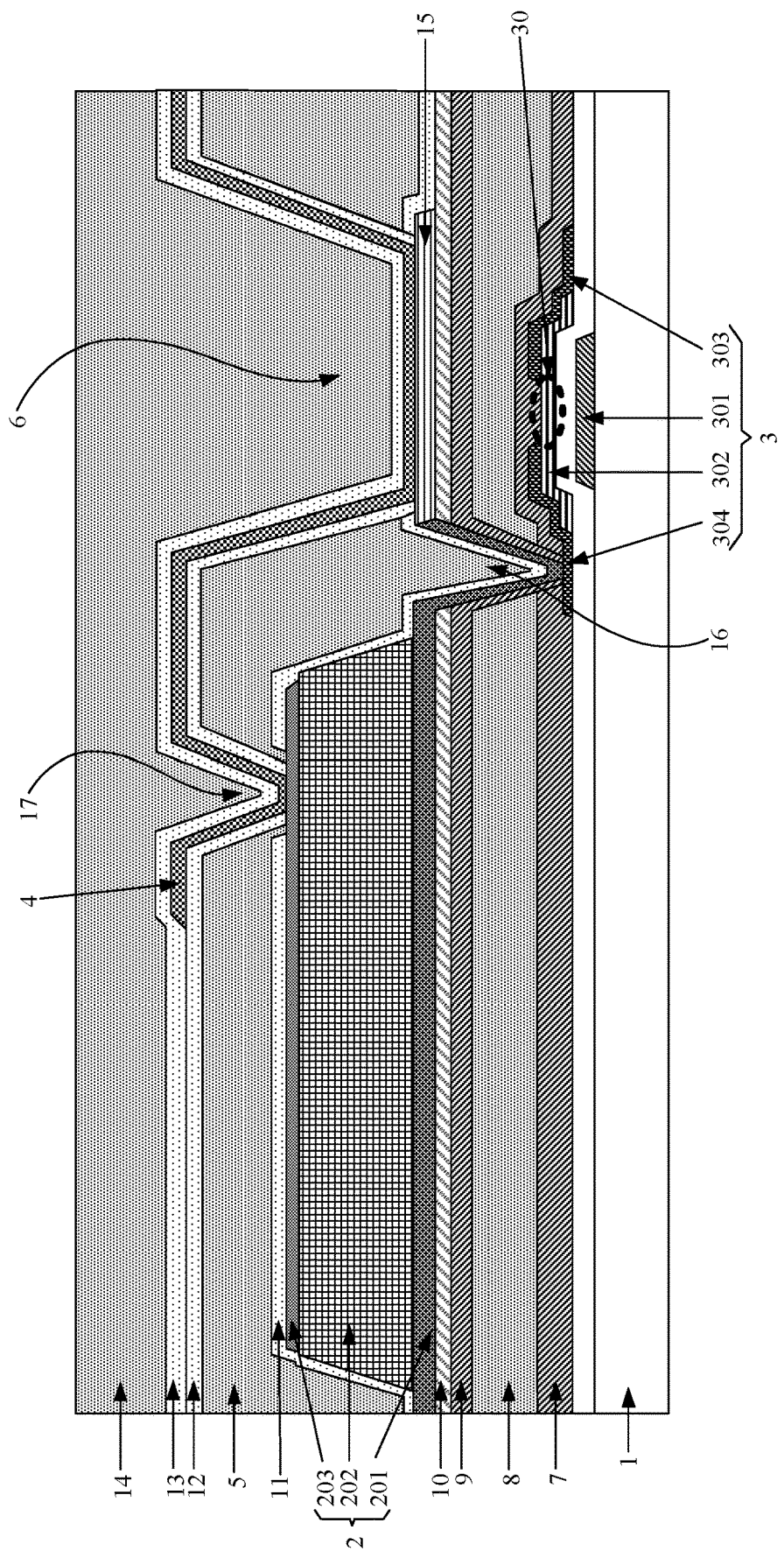
FIG. 6 is a further another schematic sectional view taken along line A-A' of FIG. 2.

FIG. 6 is a further another schematic sectional view taken along line A-A' of FIG. 2, and as shown in FIG. 6, in some implementations, the detection pixel unit Pix further includes a sacrificial layer 10, the sacrificial layer 10 being located between the thin film transistor 3 and the photoelectric conversion part 2, a material of the sacrificial layer 10 including an oxide; at least part of the orthographic projection of the channel region 30 on the base substrate 1 is located within an orthographic projection of the sacrificial layer 10 on the base substrate 1.

In the processes of manufacturing the photoelectric conversion part 2 and manufacturing various passivation layers after the process of manufacturing the sacrificial layer 10, a large amount of hydrogen atoms may be generated, and the hydrogen atoms may permeate toward the thin film transistor 3 therebelow. In the embodiment of the present disclosure, by disposing the sacrificial layer 10 between the thin film transistor 3 and the photoelectric conversion part 2, the sacrificial layer 10 can chemically react with hydrogen atoms generated by the subsequent processes, thereby playing a role of consuming and blocking hydrogen atoms, and further preventing hydrogen atoms from permeating into the thin film transistor 3; therefore, the provision of the sacrificial layer 10 can reduce the content of hydrogen atoms in the channel region 30 to a certain extent, thereby effectively reducing the conductivity of the thin film transistor 3 being turned off, preventing the channel region 30 from becoming a conductor, and greatly improving the stability of the thin film transistor 3. In some implementations, the orthographic projection of the channel region 30 on the base substrate 1 is completely located within the orthographic projection of the sacrificial layer 10 on the base substrate 1, and then the effect of the sacrificial layer 10 on blocking the hydrogen atoms from permeating towards the channel region 30 is better.

In some implementations, a material of the sacrificial layer 10 includes any one of Indium Zinc Oxide (IZO), Indium Tin Oxide (ITO), Indium Gallium Zinc Oxide (IGZO), Indium Tin Zinc Oxide (ITZO), or Indium gallium Tin Oxide (GITO). In such case, the sacrificial layer 10 can react more easily with hydrogen atoms, and can consume more hydrogen atoms, thereby can protect the thin film transistor 3.

In some implementations, the sacrificial layer 10 is in contact with an end of the photoelectric conversion part 2 close to the base substrate 1, and sacrificial layers 10 in different detection pixel units Pix are insulated from each other. In the embodiment of the present disclosure, since the sacrificial layer 10 is electrically connected to the photoelectric conversion part 2, no capacitance is generated therebetween; meanwhile, the sacrificial layers 10 of the detection pixel units Pix are independent and insulated from each other, so that mutual influence between the sacrificial layers 10 of different detection pixel units Pix is avoided, the problem of signal crosstalk can be avoided, and the performance of the product is further improved.

In the embodiment of the present disclosure, the orthographic projection of the bias voltage line 4 on the base substrate 1 completely covers the orthographic projection of the channel region 30 on the base substrate 1, the orthographic projection of the sacrificial layer 10 on the base substrate 1 at least partially covers the orthographic projection of the channel region 30 on the base substrate 1, and the orthographic projection of the first via hole 6 on the base substrate 1 at least partially covers the orthographic projection of the channel region 30 on the base substrate 1, which easily causes the bias voltage line 4 to contact the sacrificial layer 10 therebelow through the first via hole 6, and causes the bias voltage line 4 to be electrically connected with the sacrificial layer 10, thereby causing a bad influence. To solve this problem, a third passivation layer 15 may be provided between the sacrificial layer 10 and the bias voltage line 4; the orthographic projection of the first via hole 6 on the base substrate 1 is located within an orthographic projection of the third passivation layer 15 on the base substrate 1. That is, at the bottom of the first via hole 6, the bias voltage line 4 is isolated from the sacrificial layer 10 by the third passivation layer 15.

To reduce the effect of the third passivation layer 15 on the channel region 30 releasing hydrogen atoms through the first via hole 6 as possible as much, the third passivation layer 15 may be made of an insulating material with relatively less compactness. In some implementations, the compactness of the third passivation layer 15 is less than that of the buffer layer 11, and the compactness of the third passivation layer 15 is less than that of the fourth passivation layer 12. In some implementations, a material of the third passivation layer 15 includes silicon oxide, a material of the buffer layer 11 includes silicon nitride, and a material of the fourth passivation layer 12 includes silicon nitride.

In some implementations, a first passivation layer 7, a first organic layer 8 and a second passivation layer 9 are further provided between the thin film transistor 3 and the photoelectric conversion part 2, the first organic layer 8 is located on a side of the first passivation layer 7 away from the base substrate 1, and the second passivation layer 9 is located on a side of the first organic layer 8 away from the base substrate 1; the sacrificial layer 10 is located between the second passivation layer 9 and the photoelectric conversion part 2. In some implementations, the sacrificial layer 10 is located on the second passivation layer and in contact with the reading electrode 201 in the photoelectric conversion part 2.

In some implementations, the first passivation layer 7, the first organic layer 8, and the second passivation layer 9 are formed therein with a second via hole 16 communicated to the second electrode 304. The photoelectric conversion part 2 includes a reading electrode 201 and a photoelectric conversion structure 202, the photoelectric conversion structure 202 being located on a side of the reading electrode 201 away from the base substrate 1; the reading electrode 201 is in contact with the second electrode 304 through the second via hole 16, and the sacrificial layer 10 is not in contact with the second electrode 304.

The first passivation layer 7 covers the thin film transistor 3, and plays roles of protection and insulation, and a material of the first passivation layer 7 may include silicon nitride, silicon oxide, or silicon oxynitride. The first organic layer 8 is located between the first passivation layer 7 and the sacrificial layer 10, and plays roles of protection and insulation, and the material of the first organic layer 8 may include organic resin materials such as polyacrylic resin, polyepoxy acrylic resin, polyester acrylate, or urethane acrylate. The second passivation layer covers the first organic layer 8, and plays roles of protection and insulation, and also improves the bonding firmness between the sacrificial layer 10 and the film layer below the second passivation layer.

It should be noted that the sacrificial layer 10 may be disposed only on the side of the first organic layer 8 away from the base substrate 1, and is not disposed in the second via hole 16; alternatively, the sacrificial layer 10 may also extend to a sidewall within the second via 16 (which is not shown in the drawings).

In the embodiment of the present disclosure, the reading electrode 201 and the second electrode 304 are both metal electrodes, and the material of the sacrificial layer 10 is the oxide material, since a contact resistance between the two metal electrodes is much smaller than a contact resistance between the metal electrode and an oxide layer, in the present disclosure, the reading electrode 201 is in contact with the second electrode 304, which may form a smaller contact resistance, and is beneficial to signal transmission.

In some implementations, the orthographic projection of the sacrificial layer 10 on the base substrate 1 and an orthographic projection of the second via hole 16 on the base substrate 1 are not overlapped with each other or are partially overlapped with each other.

In a case where the orthographic projection of the sacrificial layer 10 on the base substrate 1 is not overlapped with the orthographic projection of the second via hole 16 on the base substrate 1, the sacrificial layer 10 may be arranged by bypassing a region where the second via hole 16 is located, or may have a hollow-out structure in the region where the second via hole 16 is located, and the manufacturing process of such structure is simple and is easy to be realized.

In a case where the orthographic projection of the sacrificial layer 10 on the base substrate 1 is partially overlapped with the orthographic projection of the second via hole 16 on the base substrate 1, the sacrificial layer 10 extends into the second via hole 16; in such structure, the sacrificial layer 10 has a larger coverage area, and a larger area for blocking, so that the thin film transistor 3 can be protected more comprehensively.

In some implementations, at least part of a boundary of the orthographic projection of the reading electrode 201 on the base substrate 1 is located within a boundary of the orthographic projection of the sacrificial layer 10 on the base substrate 1.

In the detection substrate, a part of the boundary of the orthographic projection of the reading electrode 201 on the base substrate 1 is located within the boundary of the orthographic projection of the sacrificial layer 10 on the base substrate 1, or an entire boundary of the orthographic projection of the reading electrode 201 on the base substrate 1 is located within the boundary of the orthographic projection of the sacrificial layer 10 on the base substrate 1. Certainly, the entire boundary of the orthographic projection of the sacrificial layer 10 on the base substrate 1 may be located within the boundary of the orthographic projection of the reading electrode 201 on the base substrate 1, or the boundary of the orthographic projection of the reading electrode 201 on the base substrate 1 may coincide with the boundary of the orthographic projection of the sacrificial layer 10 on the base substrate 1.

Two cases will be specifically described below.

In a first case, referring to FIG. 6, the boundary of the orthographic projection of the reading electrode 201 on the base substrate 1 is located within the boundary of the orthographic projection of the sacrificial layer 10 on the base substrate 1. Here, the boundary of the orthographic projection of the reading electrode 201 on the base substrate 1 refers to an outer boundary of the orthographic projection of the reading electrode 201 on the base substrate 1, and the boundary of the orthographic projection of the sacrificial layer 10 on the base substrate 1 refers to an outer boundary of the orthographic projection of the sacrificial layer 10 on the base substrate 1.

In this case, a relatively flat reading electrode 201 may be formed, and the photoelectric conversion structure 202 formed on the reading electrode 201 subsequently is also relatively flat, which is beneficial to improving the performance of the photoelectric conversion structure 202.

In a second case, the boundary of the orthographic projection of the reading electrode 201 on the base substrate 1 is located outside the boundary of the orthographic projection of the sacrificial layer 10 on the base substrate 1 (which is not shown in the drawings).

In this case, a size of the reading electrode 201 may be made slightly larger, and a size of the sacrificial layer 10 may be made slightly smaller, so that a reading speed of the reading electrode 201 can be increased; however, the formed reading electrode 201 may have a step or a height difference at an edge of the sacrificial layer 10, which is not favorable for forming a flat photoelectric conversion structure 202 subsequently.

In some implementations, an orthographic projection of the photoelectric conversion structure 202 on the base substrate 1 does not overlap with the orthographic projection of the second via hole 16 on the base substrate 1. That is, no part of the photoelectric conversion part 2 is provided within the second via hole 16. The photoelectric conversion structure 202 may be disposed by bypassing a region where the second via hole 16 is located, or may have a hollow-out structure in the region where the second via hole 16 is located, which is not limited herein. Such design is advantageous to forming a flat photoelectric conversion part 2 to improve the performance of the photoelectric conversion part 2. Certainly, the photoelectric conversion part 2 may cover the second via hole 16, which may increase the filling ratio, but a bottom of the photoelectric conversion part 2 is not flat, resulting in poor performance of photoelectric conversion.

In some implementations, in order to improve the reading efficiency of the reading electrode 201, a boundary of the orthographic projection of the photoelectric conversion structure 202 on the base substrate 1 is located within the boundary of the orthographic projection of the reading electrode 201 on the base substrate 1. Here, the boundary of the orthographic projection of the photoelectric conversion structure 202 on the base substrate 1 refers to an outer boundary of the orthographic projection of the photoelectric conversion structure 202 on the base substrate 1, and the boundary of the orthographic projection of the reading electrode 201 on the base substrate 1 refers to the outer boundary of the orthographic projection of the reading electrode 201 on the base substrate 1.

It should be noted that a case where the boundary of the orthographic projection of the photoelectric conversion structure 202 on the base substrate 1 coincides with the boundary of the orthographic projection of the reading electrode 201 on the base substrate 1 belongs to the above mentioned case in which the boundary of the orthographic projection of the photoelectric conversion structure 202 on the base substrate 1 is located within the boundary of the orthographic projection of the reading electrode 201 on the base substrate 1.

In some implementations, an orthographic projection of the conductive electrode 203 on the base substrate 1 is located within the orthographic projection of the photoelectric conversion structure 202 on the base substrate 1.

With continued reference to FIG. 1, the detection substrate further includes a plurality of gate lines 21 arranged in a first direction and a plurality of signal reading lines 22 arranged in a second direction. The gate lines 21 intersect with the signal reading lines 22 to form a plurality of pixel regions, where the detection pixel units Pix are located in the pixel regions, and the first direction intersects with the second direction. Each gate line 21 is electrically connected to at least the gate electrodes 301 of the thin film transistors 3 in a line of detection pixel units Pix arranged in the second direction, and each signal reading line 22 is electrically connected to at least the first electrodes 303 of the thin film transistors 3 in a line of detection pixel units Pix arranged in the first direction. FIG. 1 illustrates a case where the first direction is a column direction, the second direction is a row direction, and the first direction is perpendicular to the second direction, which is only an exemplary case and does not limit the technical solution of the present disclosure.

The gate line 21 may supply a control signal to the gate electrode 301 of the thin film transistor 3 to control the thin film transistor 3 to be turned on or off. The photoelectric conversion part 2 outputs, through the thin film transistor 3, the electric signal converted from visible light, and the electric signal is transmitted to a processing unit through the signal reading line 22, and the processing unit processes the electric signal to display an image.

It should be noted that the gate lines 21 and the gate electrodes 301 of the thin film transistors 3 may be provided in a same layer, and the signal reading lines 22 and the first electrodes and the second electrodes of the thin film transistors 3 may be provided in a same layer, so as to reduce the number of patterning processes and reduce the cost. The term "being provided in a same layer" here means being manufactured by using a single patterning process. The single patterning process refers to a process for forming a desired layer structure through one film formation process and photoetching processes. The single patterning process includes processes of film forming, exposure, development, etching, stripping and the like.

In some implementations, the detection pixel unit Pix includes the sacrificial layer 10 therein, the orthographic projection of the sacrificial layer 10 on the base substrate 1 and an orthographic projection of the gate line 21 on the base substrate 1 are not overlapped with each other, and the orthographic projection of the sacrificial layer 10 on the base substrate 1 and an orthographic projection of the signal reading line 22 on the base substrate 1 are not overlapped with each other.

With continued reference to FIG. 3a, the sacrificial layer 10 includes a first portion 10a and a second portion 10b connected with each other, and a part of the first portion 10a close to the gate line 21 or the signal reading line 22 protrudes from the second portion 10b. In FIG. 3a, a black dashed line is only used to clearly separate the first portion 10a from the second portion 10b, but this dashed line does not actually exist.

A line width W1 of a part of the signal reading line 22 close to the first portion 10a is smaller than a line width W2 of a part of the signal reading line 22 close to the second portion 10b, and a line width W3 of a part of the gate line 21 close to the first portion 101 is smaller than a line width W4 of a part of the gate line 21 close to the second portion 10b.

Referring to FIG. 3a, an orthographic projection of the thin film transistor 3 on the base substrate 1 is located within an orthographic projection of the first portion 10a of the sacrificial layer 10 on the base substrate 1, and an orthographic projection of the second portion 10b on the base substrate 1 and the orthographic projection of the thin film transistor 3 on the base substrate 1 are not overlapped with each other.

A part of the first portion 10a of the sacrificial layer 10, which is close to the gate line 21 or the signal reading line 22, protrudes from the second portion 10b, so that on one hand, a coverage area of the sacrificial layer 10 can be enlarged as much as possible without increasing an originally designed area of the sacrificial layer 10, so as to ensure that the orthographic projection of the thin film transistor 3 on the base substrate 1 is within the orthographic projection of the first portion 10a on the base substrate 1, and thus ensure that the whole thin film transistor 3 is protected; on the other hand, it is advantageous to improving the filling ratio of the photoelectric conversion part 2 to further improve the detection accuracy.

Since the line widths of the signal reading line 22 and the gate line 21 may directly affect the resistances of the signal reading line 22 and the gate line 21, and further affect data transmission rate. By adopting the above line widths of the signal reading line 22 and the gate line 21, on one hand, the influence of the line widths of the signal reading line 22 and the gate line 21 is reduced as much as possible, thereby ensuring the data transmission rate; on the other hand, the originally designed area of the sacrificial layer 10 may be utilized as much as possible, and the designed area is not additionally increased, so that the detection accuracy of the detection substrate is ensured.

Figure 7:
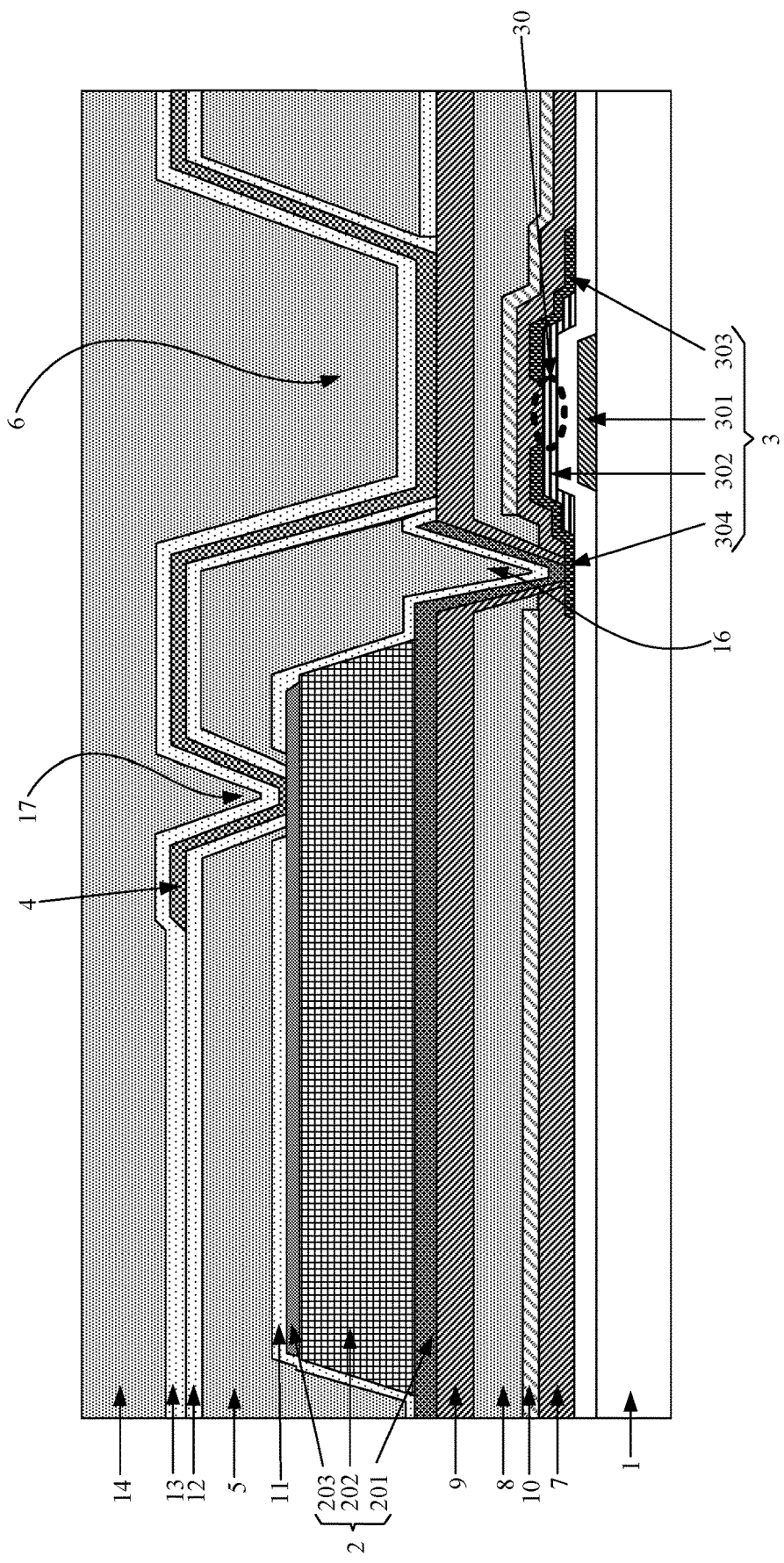
FIG. 7 is a yet another cross-sectional view taken along line A-A' of FIG. 2.

FIG. 7 is a yet another cross-sectional view taken along line A-A' of FIG. 2, and as shown in FIG. 7, the sacrificial layer 10 is located between the first passivation layer 7 and the first organic layer 8, unlike the above case where the sacrificial layer 10 is located between the second passivation layer 9 and the photoelectric conversion part 2.

Figure 8:
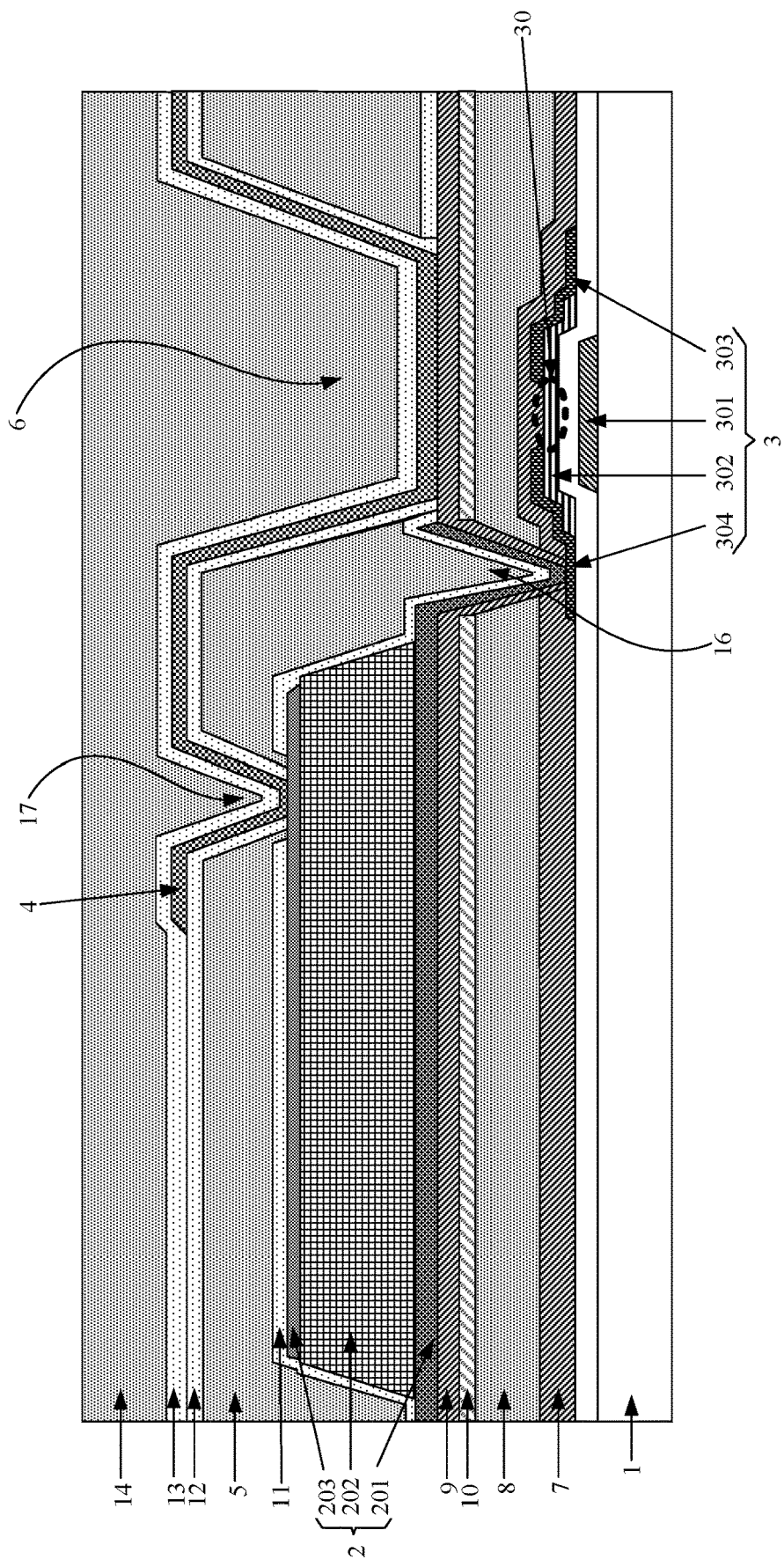
FIG. 8 is a still another cross-sectional view taken along line A-A' of FIG. 2.

FIG. 8 is a still another cross-sectional view taken along line A-A' of FIG. 2, and as shown in FIG. 8, the sacrificial layer 10 is located between the first organic layer 8 and the second passivation layer 9, unlike the above case where the sacrificial layer 10 is located between the second passivation layer 9 and the photoelectric conversion part 2 or between the first passivation layer 7 and the first organic layer 8.

It should be noted that, in the cases shown in FIGS. 7 and 8, since the second passivation layer 9 is provided above the sacrificial layer 10 so that the sacrificial layer 10 is no longer electrically connected with the photoelectric conversion part 2, and the sacrificial layer 10 is separated from the bias voltage line 4 by the second passivation layer 9, the third passivation layer 15 described above is not to be provided in the cases shown in FIGS. 7 and 8.

It should be noted that, in the cases shown in FIGS. 7 and 8, since the sacrificial layer 10 is not electrically connected with the photoelectric conversion part 2, the sacrificial layers 10 in different pixel units Pix may be connected together, and in such case, the sacrificial layers 10 may be an entire surface sacrificial layer.

In addition, in the cases shown in FIGS. 7 and 8, the orthographic projection of the channel region 30 on the base substrate 1 is located within the orthographic projection of the sacrificial layer 10 on the base substrate 1, in such case, the effect of the sacrificial layer 10 for blocking the hydrogen atoms from permeating towards the channel region 30 is better.

Referring to FIGS. 4 to 8, in the embodiment of the present disclosure, since the first passivation layer 7 and the second passivation layer 9 cover the channel region 30, the first passivation layer 7 and the second passivation layer 9 may be made of a material with a relatively small compactness. For example, the material of the first passivation layer 7 includes silicon oxide, and the material of the second passivation layer 9 includes silicon oxide.

In some implementations, the dielectric layer is formed therein with a third via hole 17 communicated to an end (i.e., the conductive electrode 203) of the photoelectric conversion part 2 away from the base substrate 1, and the bias voltage line 4 is in contact with the end (i.e., the conductive electrode 203) of the photoelectric conversion part 2 away from the base substrate 1 through the third via hole 17. For example, in the case shown in FIG. 4, the second organic layer 5 serves as the dielectric layer between the photoelectric conversion part 2 and the bias voltage line 4, and in such case, the third via hole 17 communicating to the conductive electrode 203 is formed in the second organic layer 5. In the cases shown in FIGS. 5 to 8, the buffer layer 11, the second organic layer, and the fourth passivation layer 12 serve as the dielectric layer between the photoelectric conversion part 2 and the bias voltage line 4, and in such case, the buffer layer 11, the second organic layer, and the fourth passivation layer 12 are formed therein with the third via hole 17 communicated to the conductive electrode 203.

Referring to FIGS. 4 to 8, in some implementations, the detection substrate further includes: a fifth passivation layer 13 and a third organic layer 14. The fifth passivation layer 13 and the third organic layer 14 may encapsulate the detection substrate. In some implementations, the fifth passivation layer 13 is made of an insulating material with relatively high compactness, such as silicon nitride, and a material of the third organic layer 14 may include organic resin materials, such as polyacrylic resin, polyepoxy acrylic resin, polyester acrylate, or urethane acrylate.

With continued reference to FIG. 1, the detection substrate may further include a gate driving unit, a processing unit, and a bias driving unit. The gate driving unit is connected with the plurality of gate lines and may provide control signals for the gate lines. The processing unit is connected with the plurality of signal reading lines and may acquire and process electric signals output by the signal reading lines. The bias driving unit is connected to a plurality of bias voltage lines 4 and may provide bias signals to the bias voltage lines 4. Specific structures of the gate driving unit, the processing unit and the bias driving unit are not limited. In addition, FIG. 1 only exemplarily shows a case where twelve detection pixel units Pix are arranged in three rows and four columns, which is only exemplary and does not limit the technical solution of the present disclosure.

Figure 9:
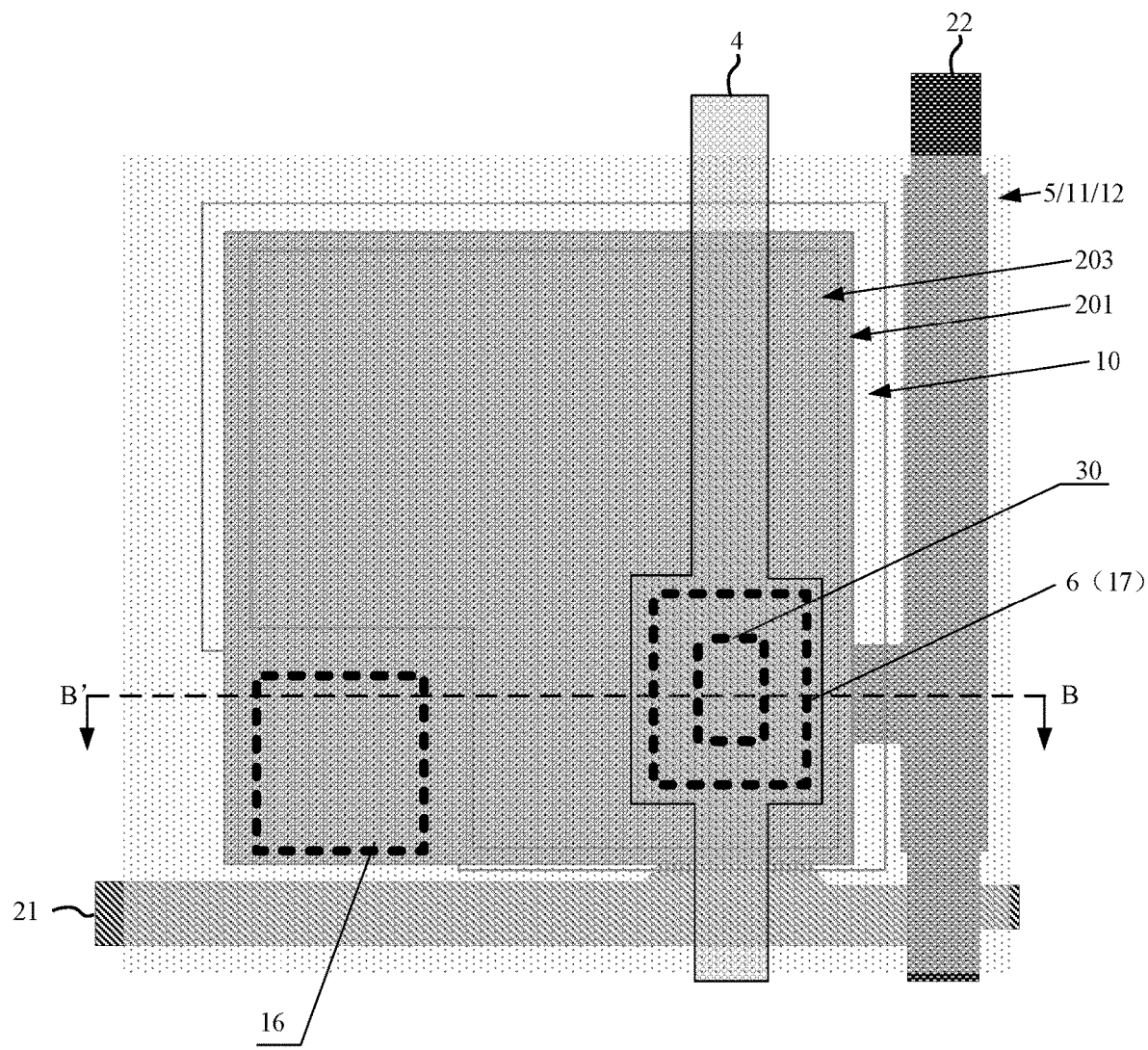
FIG. 9 is a schematic diagram of a structure of a detection pixel unit according to an embodiment of the present disclosure.
Figure 10A:
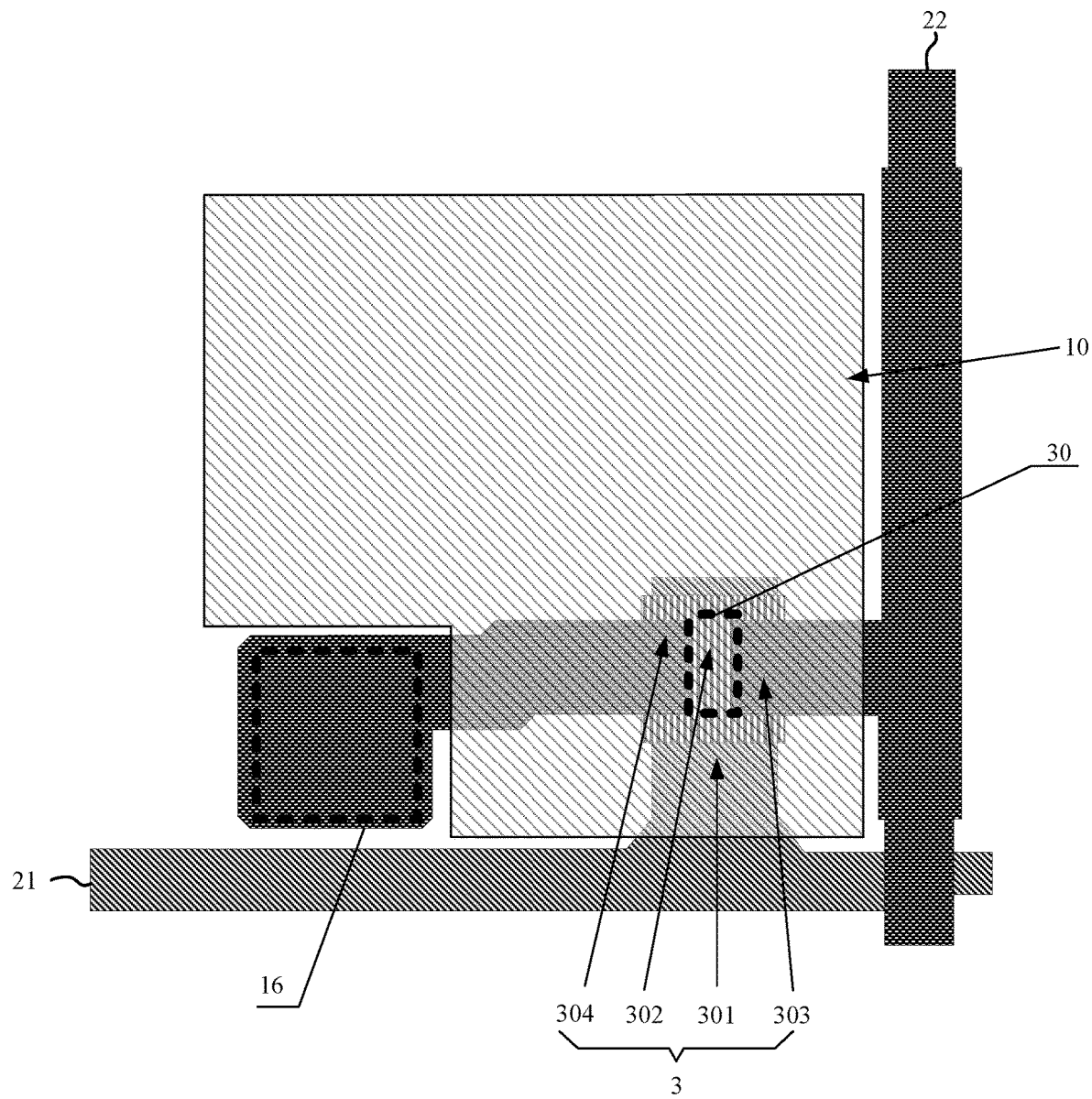
FIG. 10a is a schematic diagram of a structure of FIG. 9 in which a sacrificial layer is formed on a side of the thin film transistor away from a base substrate.
Figure 10B:
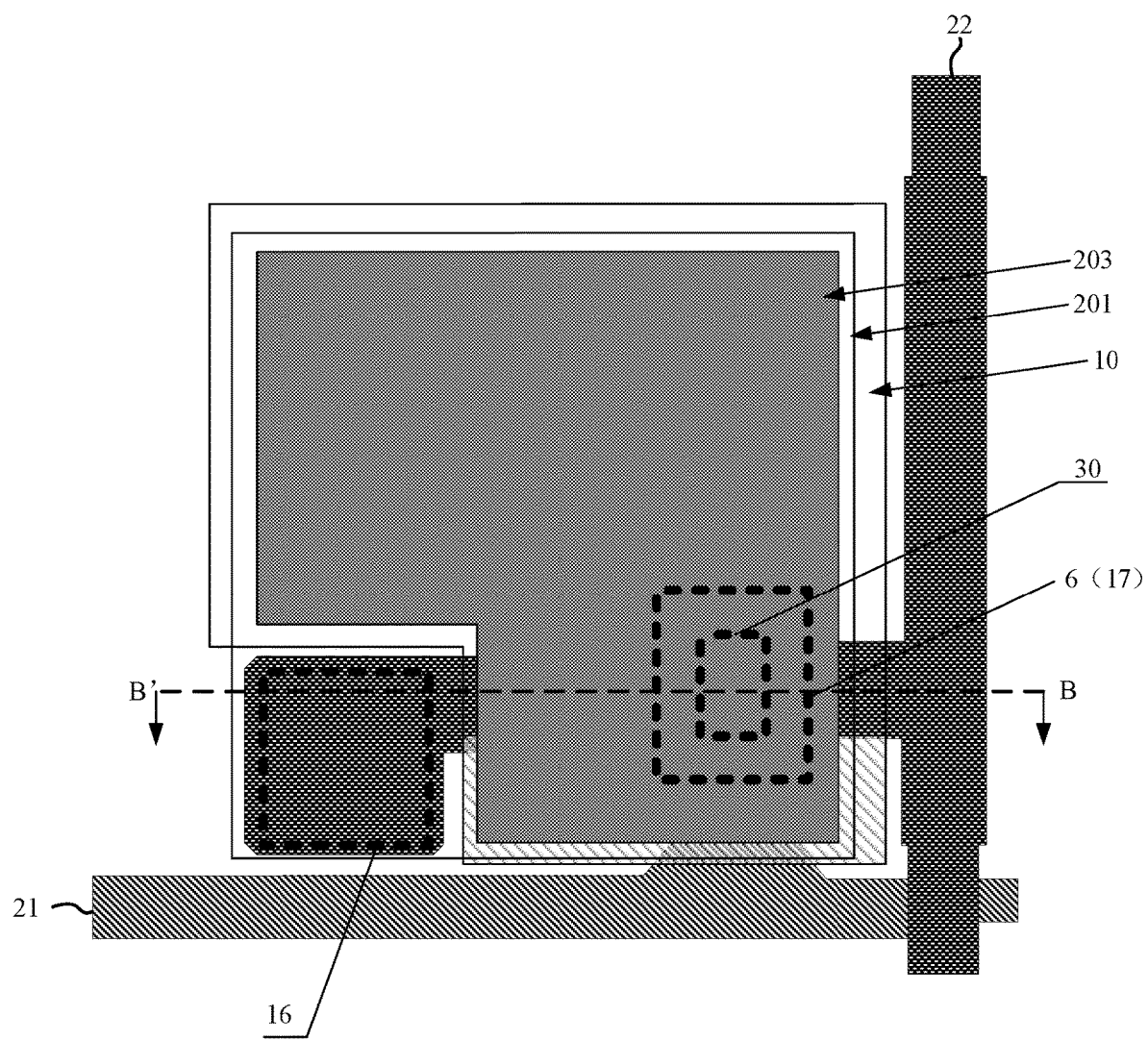
FIG. 10b is a schematic diagram of a structure of FIG. 9 in which a photoelectric conversion part is formed on the side of the thin film transistor away from the base substrate.
Figure 10C:
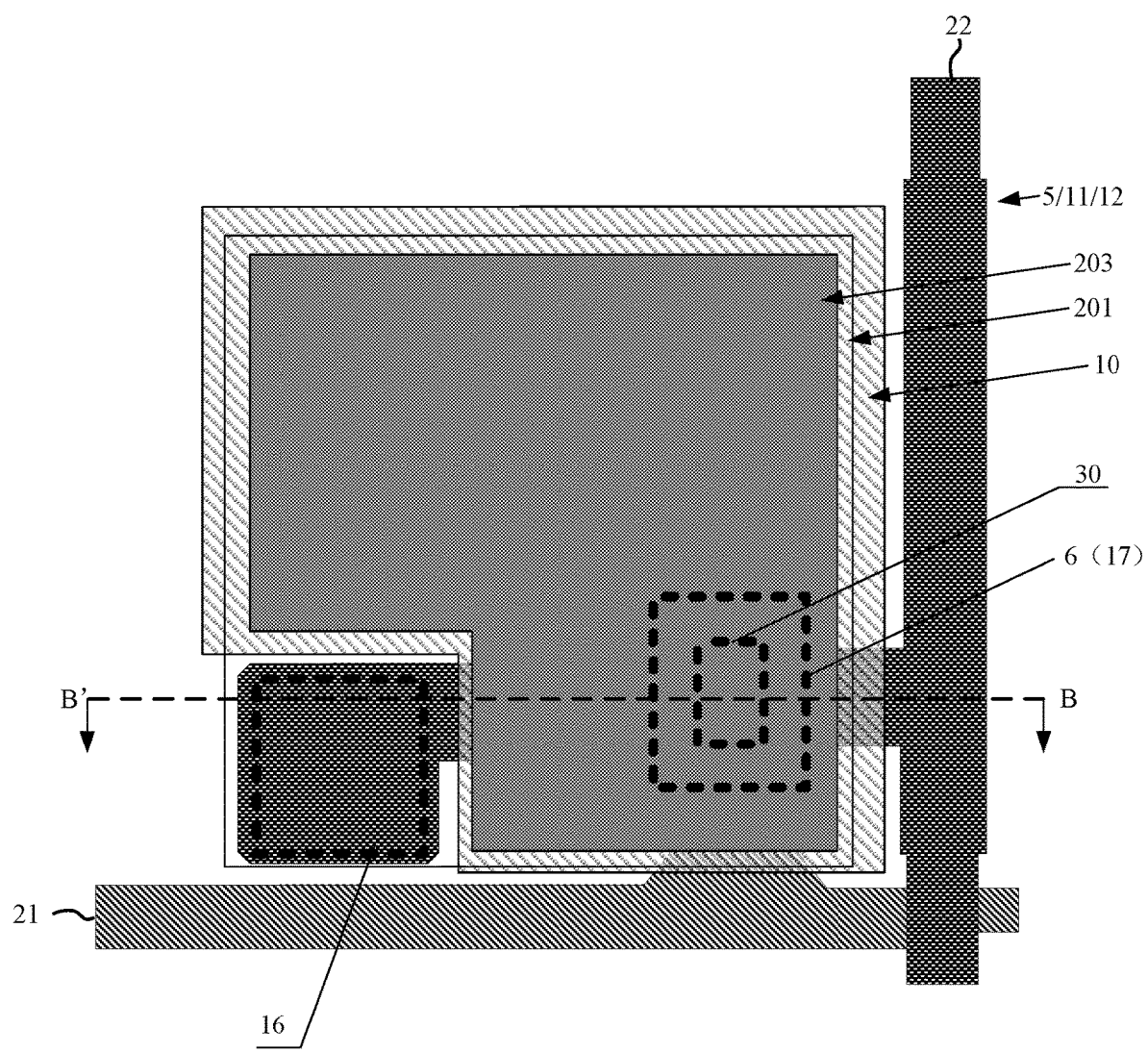
FIG. 10c is a schematic diagram of a structure of FIG. 9 in which a dielectric layer is formed on a side of the photoelectric conversion part away from the base substrate.
Figure 11:
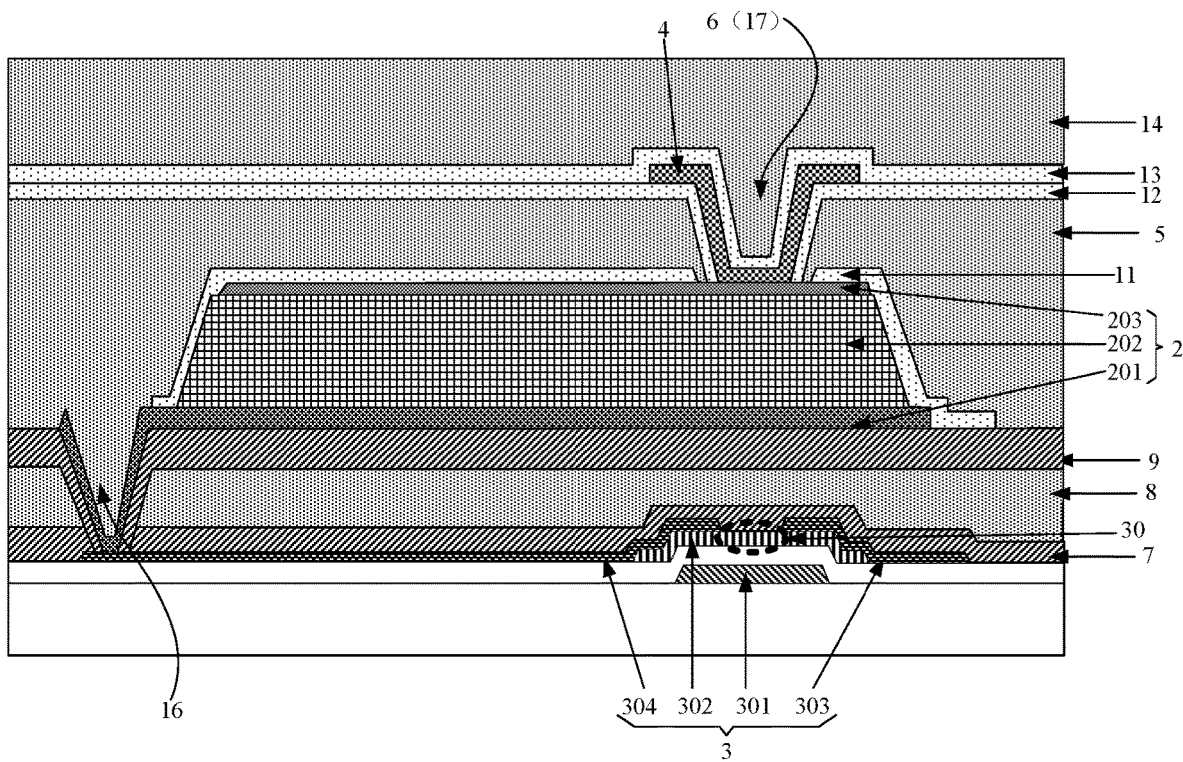
FIG. 11 is a schematic cross-sectional view taken along line B-B' of FIG. 9.
Figure 12:
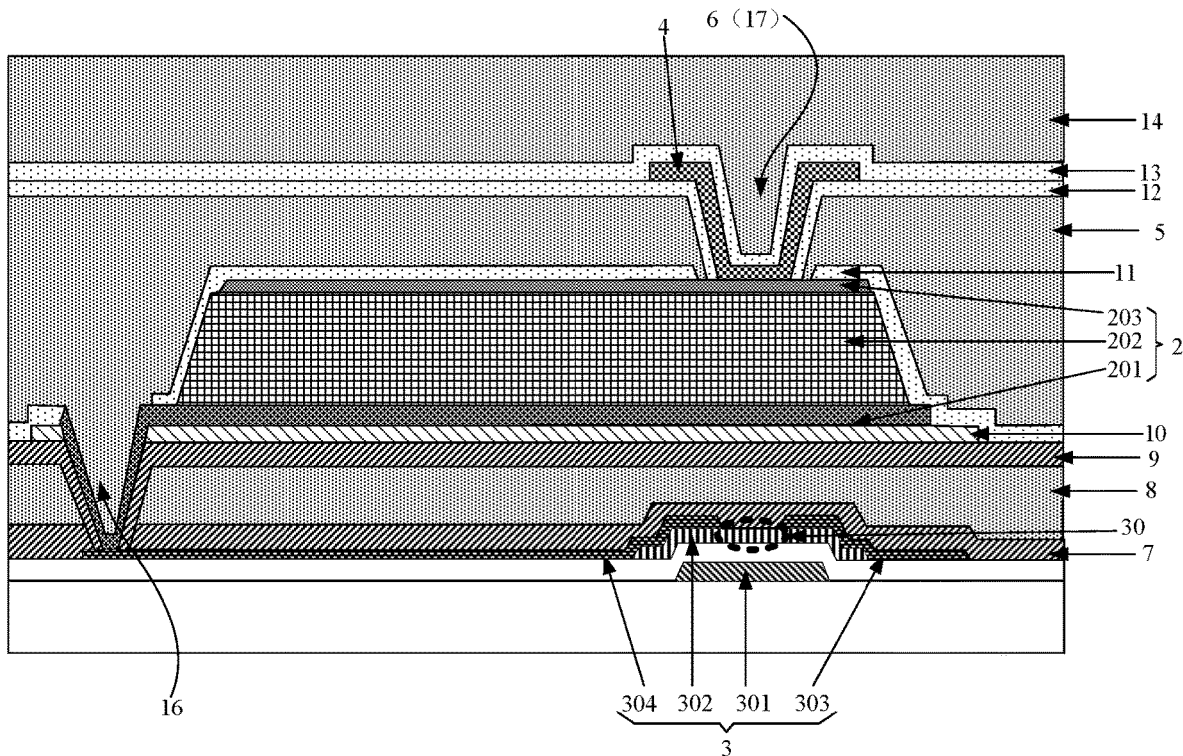
FIG. 12 is another cross-sectional view taken along line B-B' of FIG. 9.

FIG. 9 is another schematic diagram of a structure of a detection pixel unit according to an embodiment of the present disclosure, FIG. 10a is a schematic diagram of a structure of FIG. 9 in which a sacrificial layer is formed on a side of the thin film transistor away from a base substrate, FIG. 10b is a schematic diagram of a structure of FIG. 9 in which a photoelectric conversion part is formed on the side of the thin film transistor away from the base substrate; FIG. 10c is a schematic diagram of a structure of FIG. 9 in which a dielectric layer is formed on a side of the photoelectric conversion part away from the base substrate, FIG. 11 is a schematic cross-sectional view taken along line B-B' of FIG. 9; FIG. 12 is another cross-sectional view taken along line B-B' of FIG. 9, and as shown in FIG. 9 to FIG. 12, the orthographic projection of the channel region 30 on the base substrate 1 is located within the orthographic projection of the photoelectric conversion part 2 on the base substrate 1, that is, the orthographic projection of the photoelectric conversion part 2 on the base substrate 1 completely covers the channel region 30, unlike the case where the orthographic projection of the channel region 30 on the base substrate 1 and the orthographic projection of the photoelectric conversion part 2 on the base substrate 1 are not overlapped with each other shown in FIG. 2, FIG. 3b, and FIG. 3c.

In some implementations, the first via hole 6 for the channel region 30 releasing the hydrogen atoms outside and the third via hole 17 for connecting the bias voltage line 4 with the conductive electrode 203 are a same via hole, and at least part of the orthographic projection of the channel region 30 on the base substrate 1 is located within an orthographic projection of the via hole on the base substrate 1.

In the embodiment of the present disclosure, the orthographic projection of the photoelectric conversion part 2 on the base substrate 1 completely covers the channel region 30, that is, the orthographic projection of the reading electrode on the base substrate 1 can completely cover the channel region, and in such case, the reading electrode can prevent light from irradiating the channel region 30 of the thin film transistor 3, so that the channel region 20 may not be covered by the bias voltage line 4. Therefore, in order to increase the light emitting area of the pixel region, the material of the bias voltage line 4 may include a transparent conductive material, such as indium tin oxide, indium zinc oxide, gallium zinc oxide, or the like.

In the case shown in FIG. 2, the light cannot be emitted from regions where the first via hole 6, the second via hole 16 and the third via hole 17 are located in the detection pixel unit Pix, while in the case shown in FIG. 9, the light cannot be emitted from only a region where the second via hole 16 is located in the detection pixel unit Pix; therefore, compared with the solution shown in FIG. 2, the solution shown in FIG. 9 can effectively increase the light emitting area of the pixel region.

It should be noted that, the case that the thin film transistor 3 is located at a lower right corner of the pixel region and the second via hole 16 is located at a lower left corner of the pixel region, shown in FIG. 9, is only for exemplary purposes and does not limit the technical solution of the present disclosure.

Certainly, in some implementations, in the case shown in FIG. 9, the sacrificial layer 10 may also be located between the thin film transistor 3 and the photoelectric conversion part 2; for the position, material, relative position relationships of the sacrificial layer 10 with respect to the channel region 30, the photoelectric conversion part 2 and the via holes, reference may be made to foregoing descriptions, and will not be repeated herein.

It should be noted that, since the first via hole 6 is located directly above the photoelectric conversion part 2, even if the sacrificial layer 10 is in contact with the end of the photoelectric conversion part 2 close to the base substrate 1, there is no risk that the bias voltage line 4 will come into contact with the sacrificial layer 10 through the first via hole 6. Therefore, the third passivation layer may not be provided.

Figure 13:
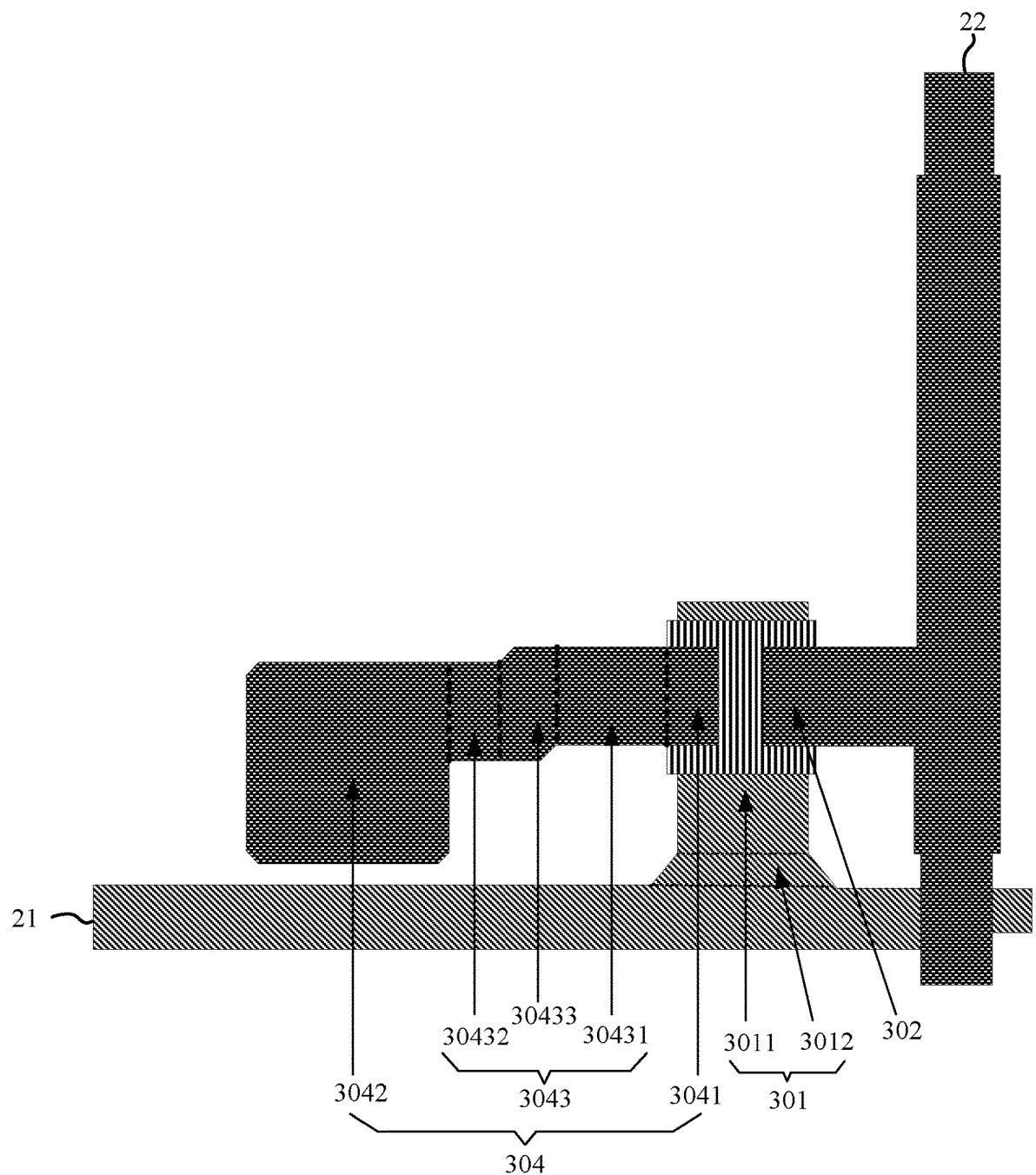
FIG. 13 is a schematic structural diagram of a gate line, a reading signal line, and a thin film transistor according to an embodiment of the present disclosure.

FIG. 13 is a schematic structural diagram of a gate line, a read signal line, and a thin film transistor in an embodiment of the present disclosure, as shown in FIG. 13, in some implementations, the second electrode 304 of the thin film transistor 3 includes: a first conductive portion 3041 for connecting with the active layer 302, a second conductive portion 3042 for connecting with the end of the photoelectric conversion part 2 close to the base substrate 1, and a third conductive portion 3043 for connecting the first conductive portion 3041 with the second conductive portion 3042, the third conductive portion 3043 being located between the first conductive portion 3041 and the second conductive portion 3042. A side edge of the first conductive portion 3041 away from the gate line 21 and a side edge of the second conductive portion 3042 away from the gate line each extend in the second direction. A distance from the side edge of the first conductive portion 3041 away from the gate line 21 to the gate line 21 is greater than a distance from the side edge of the second conductive portion 3042 away from the gate line 21 to the gate line 21. With such design, the second conductive portion 3042 for connecting with the end of the photoelectric conversion part 2 close to the base substrate 1 may be made closer to the gate line 21, which is beneficial to improving the filling ratio of the pixel region by the detection pixel unit Pix.

In some implementations, the third conductive portion 3043 includes: a first connecting part 30431 connected to the first conductive portion 3041, a second connecting part 30432 connected to the second conductive portion 3042, and a third connecting part 30433 connecting the first connecting part 30431 with the second connecting part 30432, the third connecting part 30433 being located between the first connecting part 30431 and the second connecting part 30432. The first connecting part 30431 extends along the second direction, and a side edge of the first connecting part 30431 away from the gate line 21 and the side edge of the first conductive portion 3041, which is connected with the first connecting part 30431, away from the gate line 21 are located in a same straight line; the second connecting part 30432 extends along the second direction, and a side edge of the second connecting part 30432 away from the gate line 21 and the side edge of the second conductive portion 3042, which is connected with the second connecting part 30432, away from the gate line are located in a same straight line. A direction in which the third connecting part 30433 extends intersects with the second direction. That is, a side of the third conductive portion 3043 close to the gate line is bent.

With continued reference to FIG. 13, the gate electrode 301 includes: a body portion 3011 and a fourth connecting part 3012 connected to the body portion 3011, the fourth connecting part 3012 being in contact with the gate line 21 corresponding thereto. A width of the fourth connecting part 3012 in the second direction is larger than a width of the body portion 3011 in the second direction. That is, a portion of the gate electrode 301 connected with the gate line 21 is widened, with such design, it is advantageous for the gate line 21 transmitting the control signal to the gate electrode 301. In some implementations, a width of the fourth connecting part 3012 in the second direction gradually decreases in a direction from the fourth connecting part 3012 towards the body portion 3011.

It should be noted that the gate line 301, the reading signal line 22, and the thin film transistor 3 shown in FIGS. 2 and 3a to 3c may be the same as those shown in FIG. 13.

Based on a same inventive concept, an embodiment of the present disclosure further provides a flat panel detector, the flat panel detector includes the detection substrate provided in the foregoing embodiment.

The flat panel detector provided by the embodiment of the present disclosure may be a flat panel X-ray detector, may be applied to the fields of medical treatment, security protection, industrial detection and the like, and has advantages of stable performance, fast reaction speed and the like. For the description of a structure of the detection substrate included in the flat panel detector, reference may be made to the contents in the foregoing embodiment, and details thereof are not repeated here.

Figure 14:
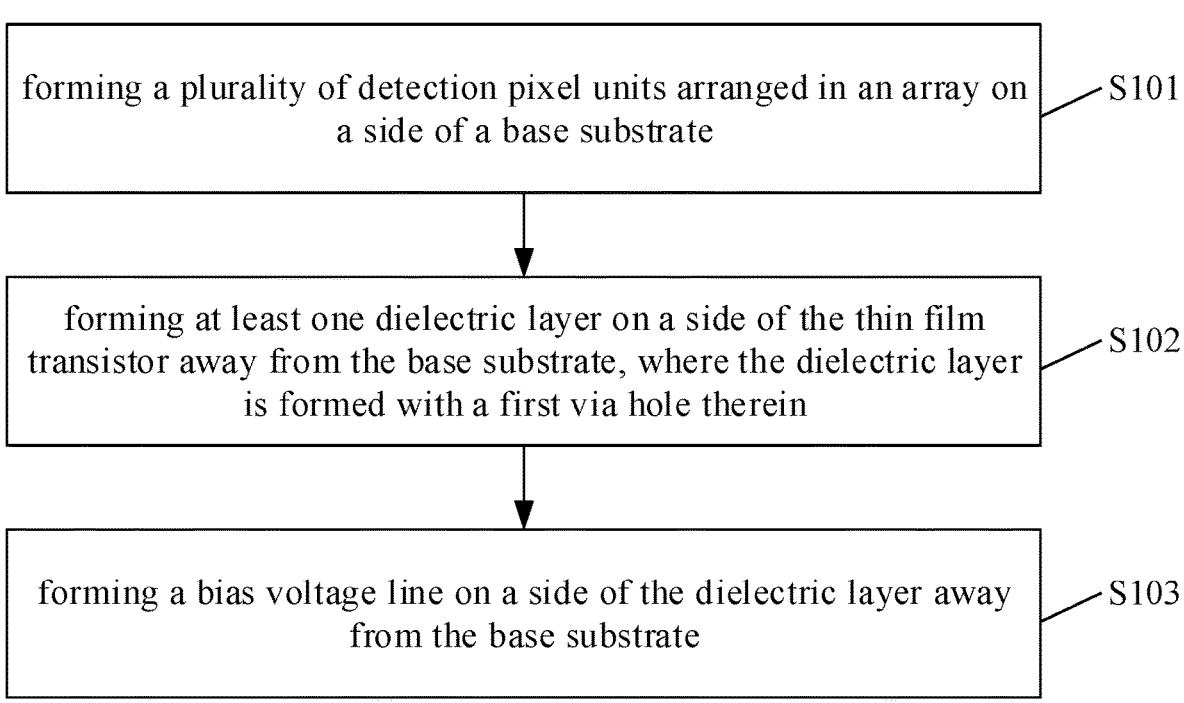
FIG. 14 is a flowchart illustrating a method for manufacturing a detection substrate according to an embodiment of the present disclosure.

An embodiment of the present disclosure further provides a method for manufacturing the detection substrate provided in the foregoing embodiment. FIG. 14 is a flowchart of the method for manufacturing the detection substrate according to the embodiment of the present disclosure, and as shown in FIG. 14, the method includes steps S101 to S103.

At step S101, forming a plurality of detection pixel units arranged in an array on a side of a base substrate.

The detection pixel unit includes: a thin film transistor and a photoelectric conversion part located on a side of the thin film transistor away from the base substrate. The thin film transistor includes: an active layer, a first electrode and a second electrode, where the first electrode and the second electrode are electrically connected with the active layer, and the active layer includes a channel region. An end of the photoelectric conversion part close to the base substrate is electrically connected with the second electrode of the thin film transistor which is in the same detection pixel unit as the photoelectric conversion part.

At step S102, forming at least one dielectric layer on a side of the thin film transistor away from the base substrate, where the dielectric layer is formed with a first via hole therein.

At least part of an orthographic projection of the channel region on the base substrate is located within an orthographic projection of the first via hole on the base substrate.

At step S103, forming a bias voltage line on a side of the dielectric layer away from the base substrate.

The bias voltage line is electrically connected to an end of the photoelectric conversion part, corresponding to the bias voltage line, away from the base substrate.

In the embodiment of the disclosure, the first via hole is provided in the at least one dielectric layer above the channel region of the thin film transistor, and the first via hole and the channel region of the thin film transistor are overlapped with each other in a direction perpendicular to the base substrate. Based on such pixel design, it is beneficial to releasing hydrogen atoms from the channel region 30 in later processes such as a high temperature annealing, that is, a content of hydrogen atoms in the channel region 30 can be effectively reduced, so as to effectively reduce the conductivity of the thin film transistor 3 being turned off, and thus prevent the channel region 30 from becoming a conductor, and enhance the stability of the thin film transistor.

Figure 15:
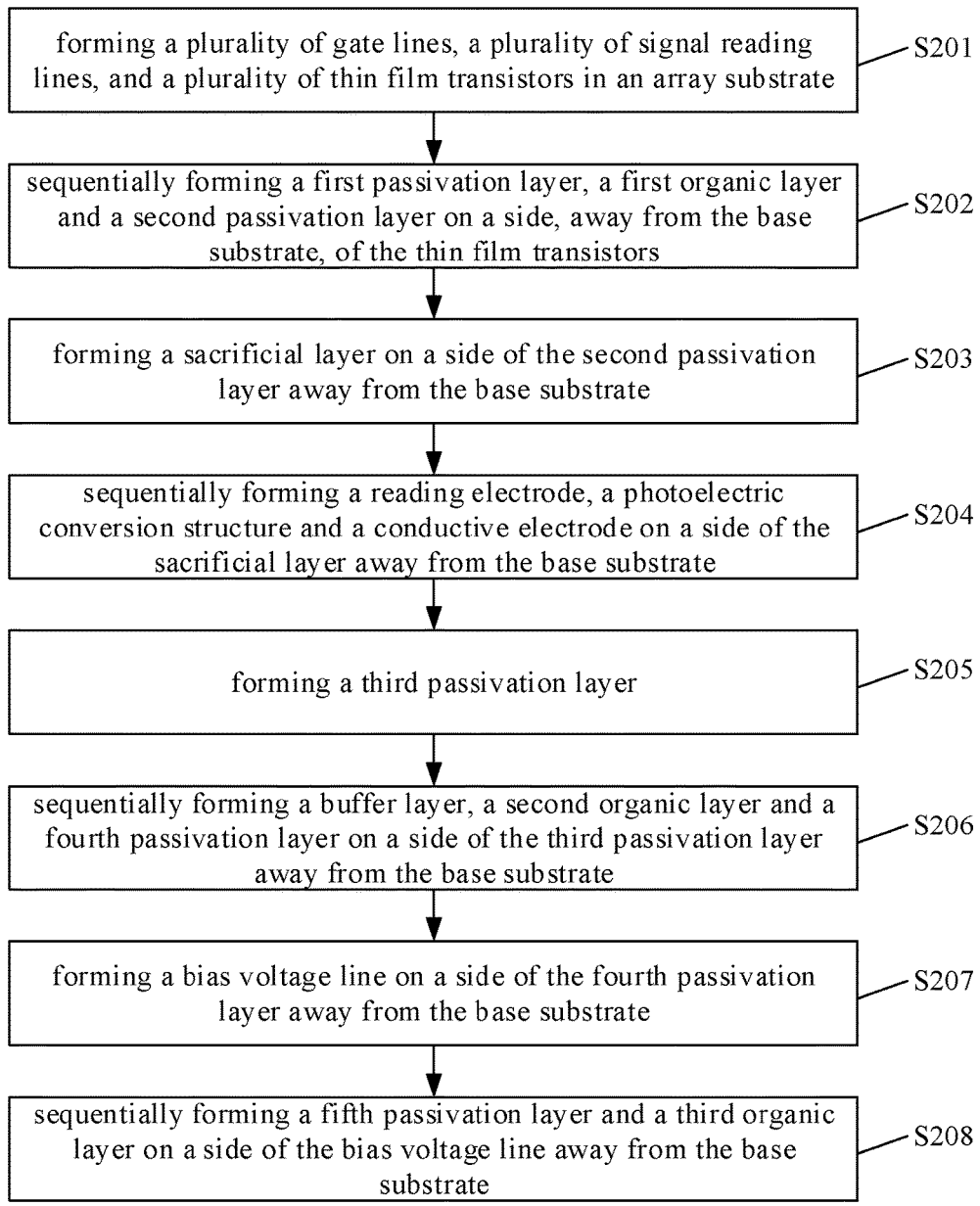
FIG. 15 is a flowchart illustrating another method for manufacturing a detection substrate according to an embodiment of the present disclosure.
Figure 16A:
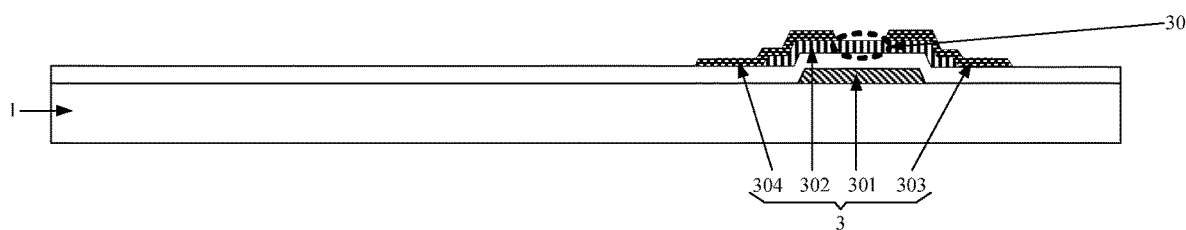
FIGS. 16a to 16g are schematic cross-sectional views of intermediate products in a process of manufacturing the detection substrate by using the method shown in FIG. 15.
Figure 16B:
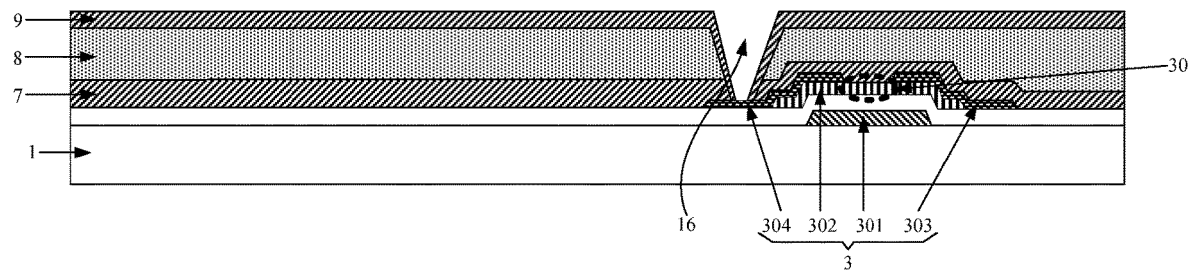
Figure 16C:
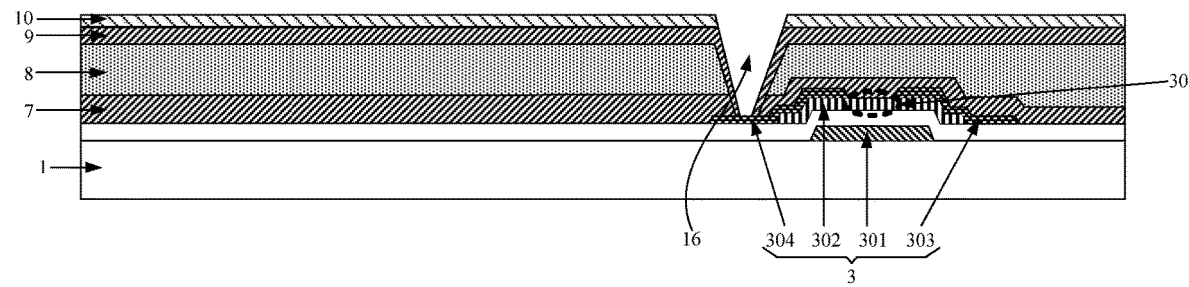
Figure 16D:
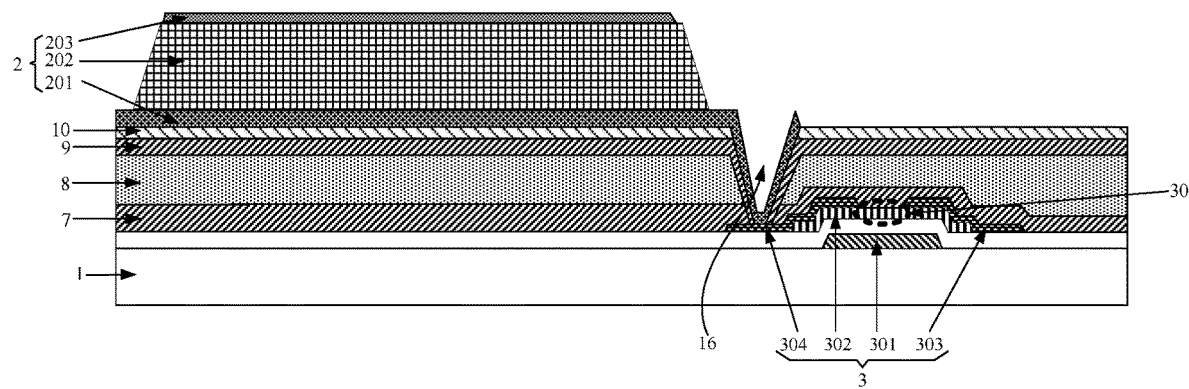
Figure 16E:
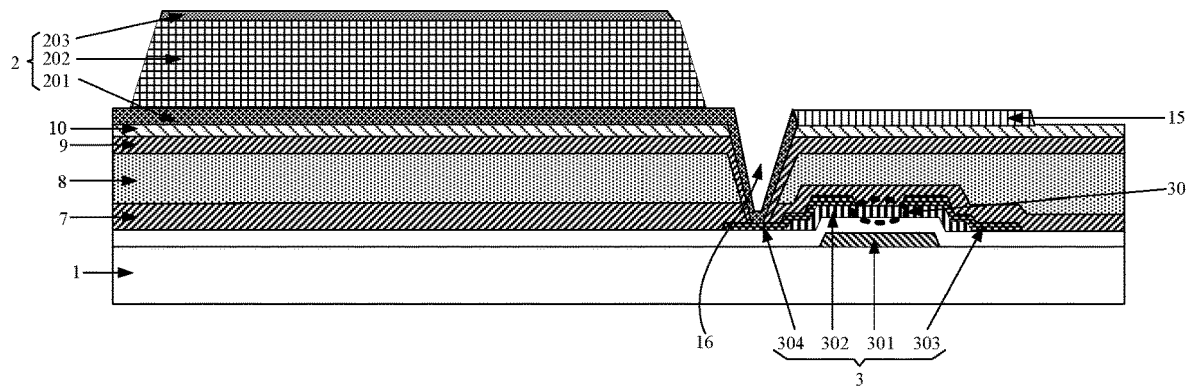
Figure 16F:
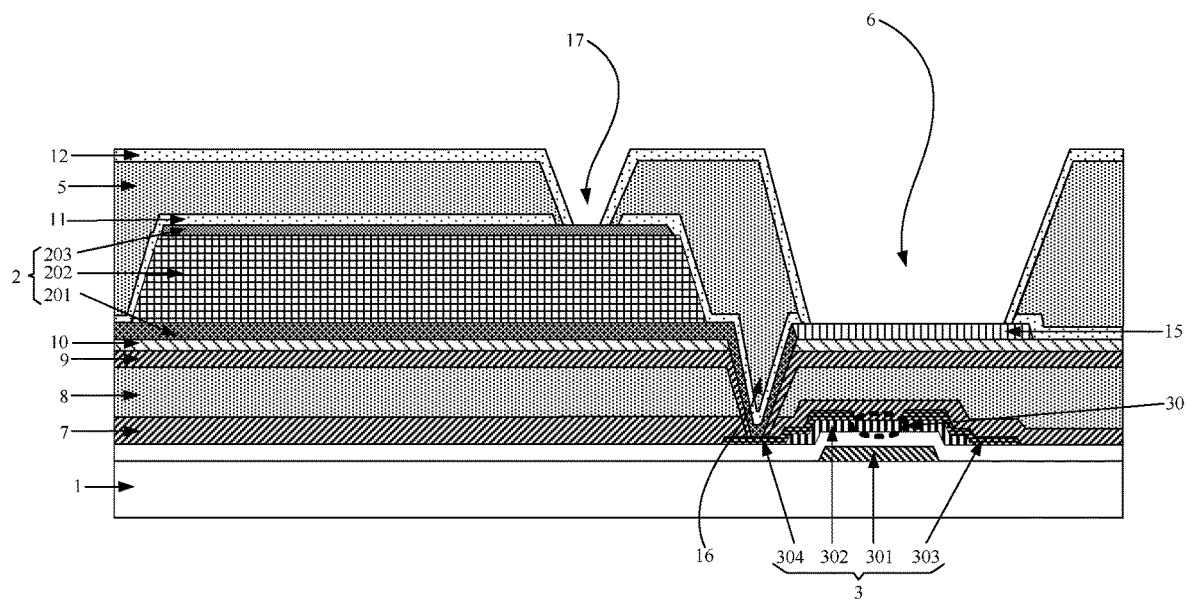
Figure 16G:
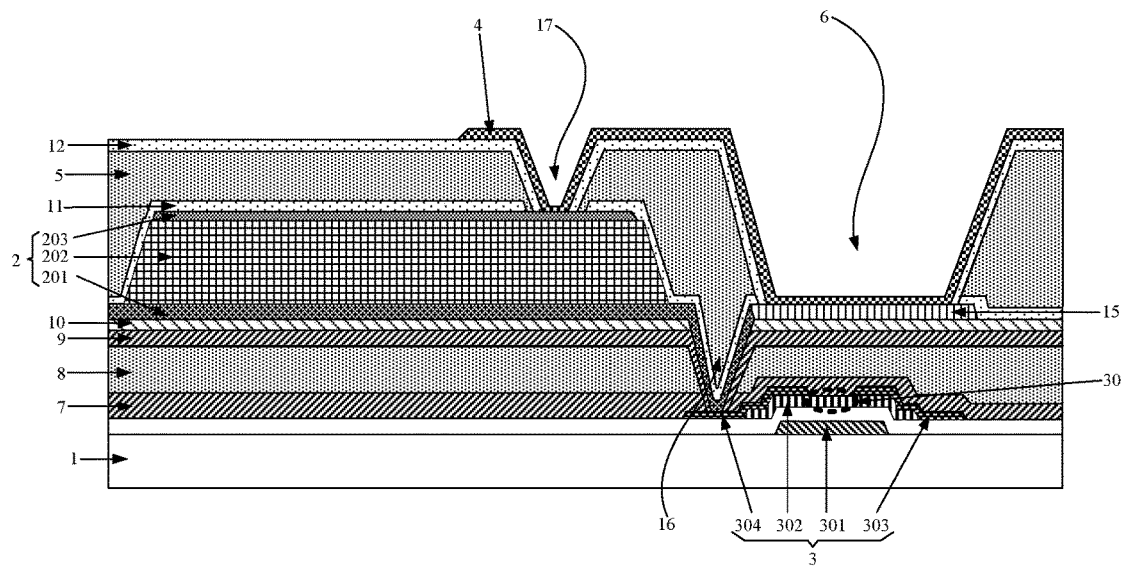

FIG. 15 is a flowchart of another method for manufacturing a detection substrate according to an embodiment of the present disclosure, and FIGS. 16a to 16g are schematic cross-sectional views of intermediate products in a process of manufacturing a detection substrate by using the method shown in FIG. 15, as shown in FIGS. 15 to 16g, the method may be used to manufacture a detection substrate having a cross section shown in FIG. 6, and the method includes steps S201 to S208.

At step S201, forming a plurality of gate lines, a plurality of signal reading lines, and a plurality of thin film transistors in an array substrate.

Referring to FIG. 16a, in step S201, the gate lines (not shown), the signal reading lines 1 (not shown), and the thin film transistor 3 may be formed on a base substrate 1 based on an array process.

At step S202, sequentially forming a first passivation layer, a first organic layer and a second passivation layer on a side, away from the base substrate, of the thin film transistors.

Referring to FIG. 16b, the first passivation layer 7, the first organic layer 8, and the second passivation layer 9 are formed with a second via hole 16 communicated to a second electrode 304 of the thin film transistor 3.

The first passivation layer 7 and the second passivation layer 9 may be made of silicon oxide, and the first organic layer 8 may be made of an organic resin material such as polyacrylic resin, polyepoxy acrylic resin, polyester acrylate, or urethane acrylate.

At step S203, forming a sacrificial layer on a side of the second passivation layer away from the base substrate.

Referring to FIG. 16c, at least part of an orthographic projection of the channel region 30 on the base substrate 1 is located within an orthographic projection of the sacrificial layer 10 on the base substrate 1.

In some implementations, the orthographic projection of the sacrificial layer 10 on the base substrate 1 and an orthographic projection of the second via hole 16 on the base substrate 1 partially overlap or do not overlap with each other, and the sacrificial layer 10 is not in contact with the second electrode 304 of the thin film transistor 3.

In some implementations, the material of the sacrificial layer 10 includes an oxide, such as at least one of indium zinc oxide, indium tin oxide, indium gallium zinc oxide, indium tin zinc oxide, or indium gallium tin oxide.

At step S204, sequentially forming a reading electrode, a photoelectric conversion structure and a conductive electrode on a side of the sacrificial layer away from the base substrate.

Referring to FIG. 16d, the reading electrode 201, the photoelectric conversion structure 202, and the conductive electrode 203 in each detection pixel unit Pix constitute the photoelectric conversion part 2. The orthographic projection of the channel region 30 on the base substrate 1 and the orthographic projection of the photoelectric conversion part 2 on the base substrate 1 are not overlapped with each other. That is, no part of the photoelectric conversion part 2 is located directly above the channel region.

In some implementations, a material of the reading electrode 201 may be a metal material, such as at least one of copper, aluminum, or titanium. A material of the conductive electrode 203 may be a transparent metal oxide, such as at least one of indium tin oxide, indium zinc oxide, or gallium zinc oxide.

At step S205, forming a third passivation layer.

Referring to FIG. 16e, in some implementations, an orthographic projection of the third passivation layer 15 on the base substrate 1 may completely cover the orthographic projection of the channel region 30 on the base substrate 1. A material of the third passivation layer 15 may be silicon oxide.

At step S206, sequentially forming a buffer layer, a second organic layer and a fourth passivation layer on a side of the third passivation layer away from the base substrate.

Referring to FIG. 16f, the buffer layer 11, the second organic layer 5 and the fourth passivation layer 12 are formed therein with a first via hole 6, and at least part of an orthographic projection of the channel region 30 on the base substrate 1 is located within an orthographic projection of the first via hole 6 on the base substrate 1. In addition, a third via hole 17 communicated to the conductive electrode 203 is formed in the buffer layer 11, the second organic layer 5, and the fourth passivation layer 12.

The buffer layer 11 and the fourth passivation layer 12 each may be made of silicon nitride, and the second organic layer 5 may be made of an organic resin material such as polyacrylic resin, polyepoxy acrylic resin, polyester acrylate, or urethane acrylate.

At step S207, forming a bias voltage line on a side of the fourth passivation layer away from the base substrate.

Referring to FIG. 16g, the bias voltage line 4 is connected to the conductive electrode 203 corresponding thereto through the third via hole 17 corresponding thereto.

It should be noted that, in some implementations, an orthographic projection of the bias voltage line 4 on the base substrate 1 completely covers the orthographic projection of the channel region 30 on the base substrate 1, and in such case, a part of the bias voltage line 4 may be located in the first via hole 6. However, due to the presence of the third passivation layer 15, the part of the bias voltage line 4 located in the first via hole 6 is not in contact with the sacrificial layer 10.

At step S208, sequentially forming a fifth passivation layer and a third organic layer on a side of the bias voltage line away from the base substrate.

Referring to FIG. 6, a material of the fifth passivation layer 13 may be silicon nitride. A material of the third organic layer 14 may be an organic resin material such as polyacrylic resin, polyepoxy acrylic resin, polyester acrylate or urethane acrylate resin.

Figure 17:
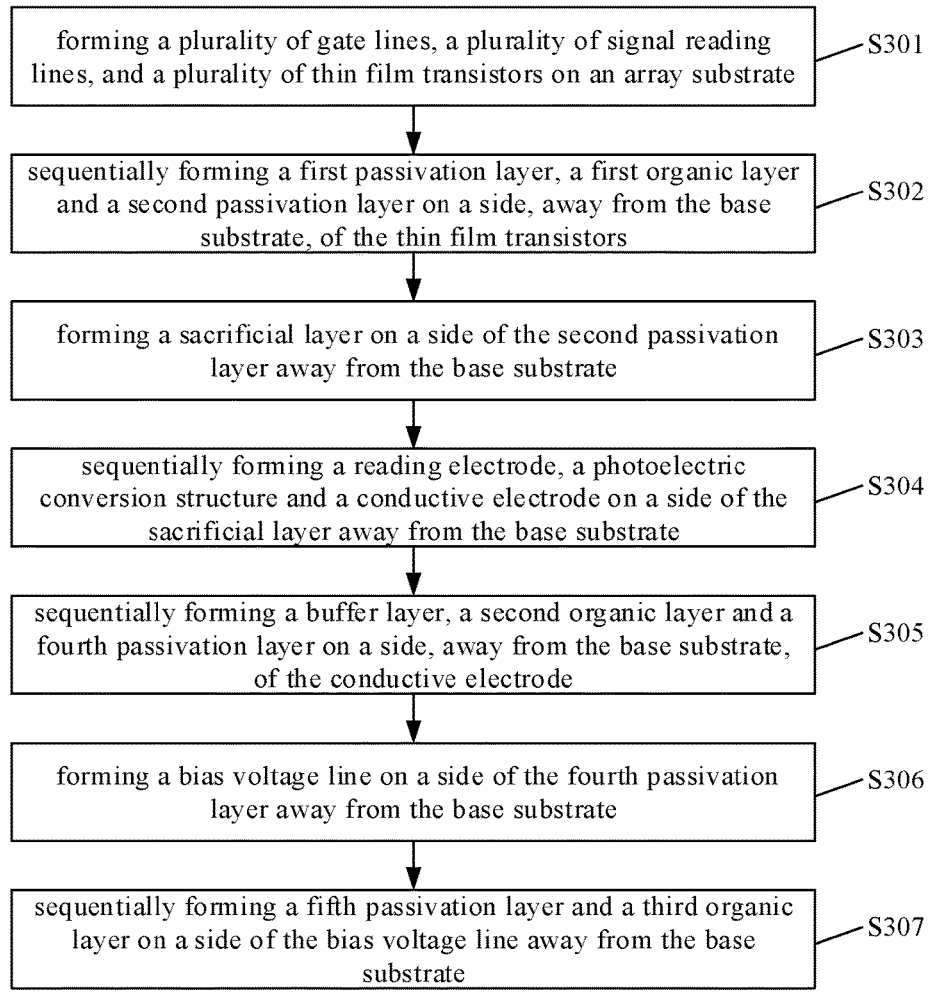
FIG. 17 is a flowchart of another method for manufacturing a detection substrate according to an embodiment of the present disclosure.

FIG. 17 is a flowchart of another method for manufacturing a detection substrate according to an embodiment of the present disclosure; FIGS. 18a to 18f are schematic cross-sectional views of intermediate products in a process of manufacturing a detection substrate by using the method of FIG. 17, which may be used to manufacture the detection substrate having a cross-section shown in FIG. 12, the method includes steps S301 to S307.

At step S301, forming a plurality of gate lines, a plurality of signal reading lines, and a plurality of thin film transistors in an array substrate.

Figure 18A:
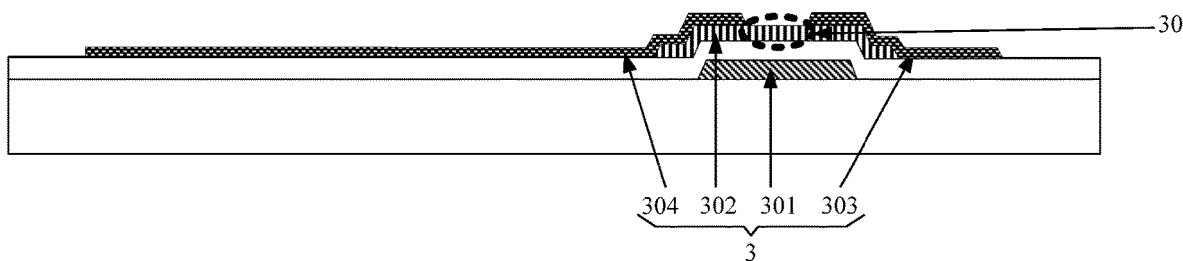
FIG. 18a to 18f are schematic cross-sectional views of intermediate products in a process of manufacturing the detection substrate by using the method shown in FIG. 17.

As shown in FIG. 18a, the second electrode 304 of the thin film transistor shown in FIG. 18a has a larger size than the second electrode 304 of the thin film transistor shown in FIG. 16a. The second electrode 304 shown in FIG. 18a may adopt the structure shown in FIG. 13.

At step S302, sequentially forming a first passivation layer, a first organic layer and a second passivation layer on a side, away from the base substrate, of the thin film transistors.

Figure 18B:
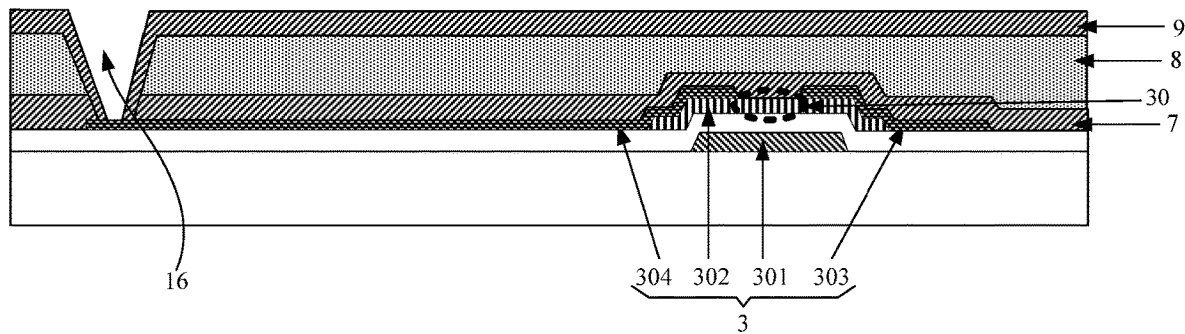

Referring to FIG. 18b, the first passivation layer 7, the first organic layer 8, and the second passivation layer 9 are formed therein with a second via hole 16 communicated to a second electrode 304 of the thin film transistor 3. The second via hole 16 shown in FIG. 18b may be the same as that shown in FIG. 12.

At step S303, forming a sacrificial layer on a side of the second passivation layer away from the base substrate.

Figure 18C:
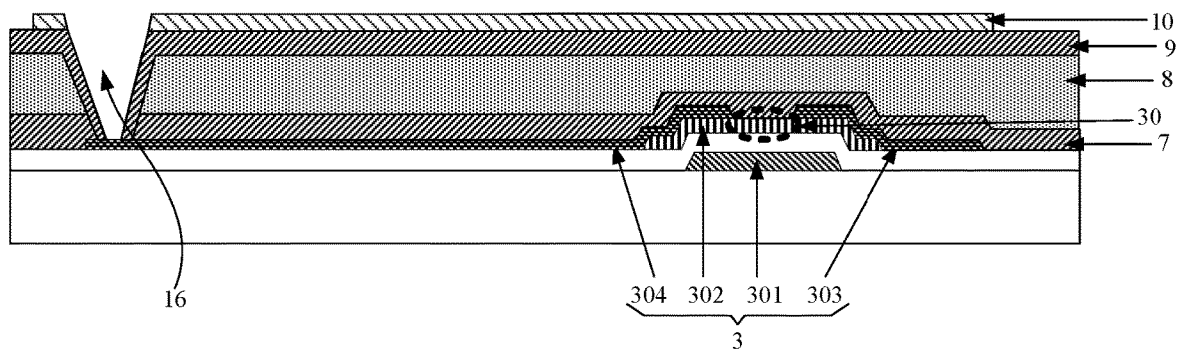

Referring to FIG. 18c, at least part of an orthographic projection of the channel region 30 on the base substrate 1 is located within an orthographic projection of the sacrificial layer 10 on the base substrate 1.

In some implementations, the orthographic projection of the sacrificial layer 10 on the base substrate 1 and the orthographic projection of the second via hole 16 on the base substrate 1 partially overlap or do not overlap with each other, and the sacrificial layer 10 is not in contact with the second electrode 304 of the thin film transistor.

At step S304, sequentially forming a reading electrode, a photoelectric conversion structure and a conductive electrode on a side of the sacrificial layer away from the base substrate.

Figure 18D:
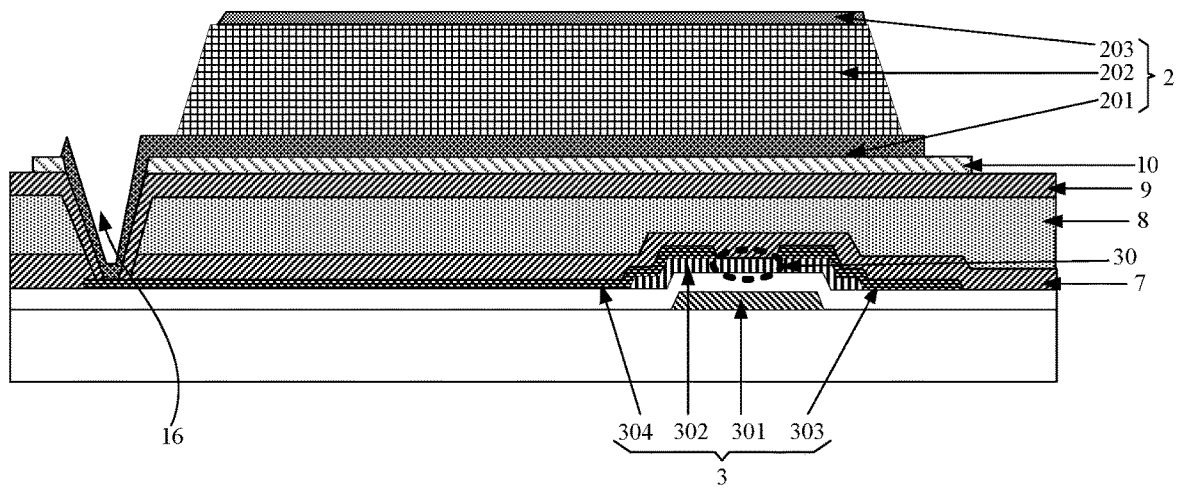

Referring to FIG. 18d, the reading electrode 201, the photoelectric conversion structure 202, and the conductive electrode 203 in each detection pixel unit Pix constitute the photoelectric conversion part 2. The orthographic projection of the channel region 30 on the base substrate 1 is located within an orthographic projection of the photoelectric conversion part 2 on the base substrate 1; that is, the orthographic projection of the photoelectric conversion part 2 on the base substrate 1 completely covers the channel region 30.

At step S305, sequentially forming a buffer layer, a second organic layer and a fourth passivation layer on a side, away from the base substrate, of the conductive electrode.

Figure 18E:
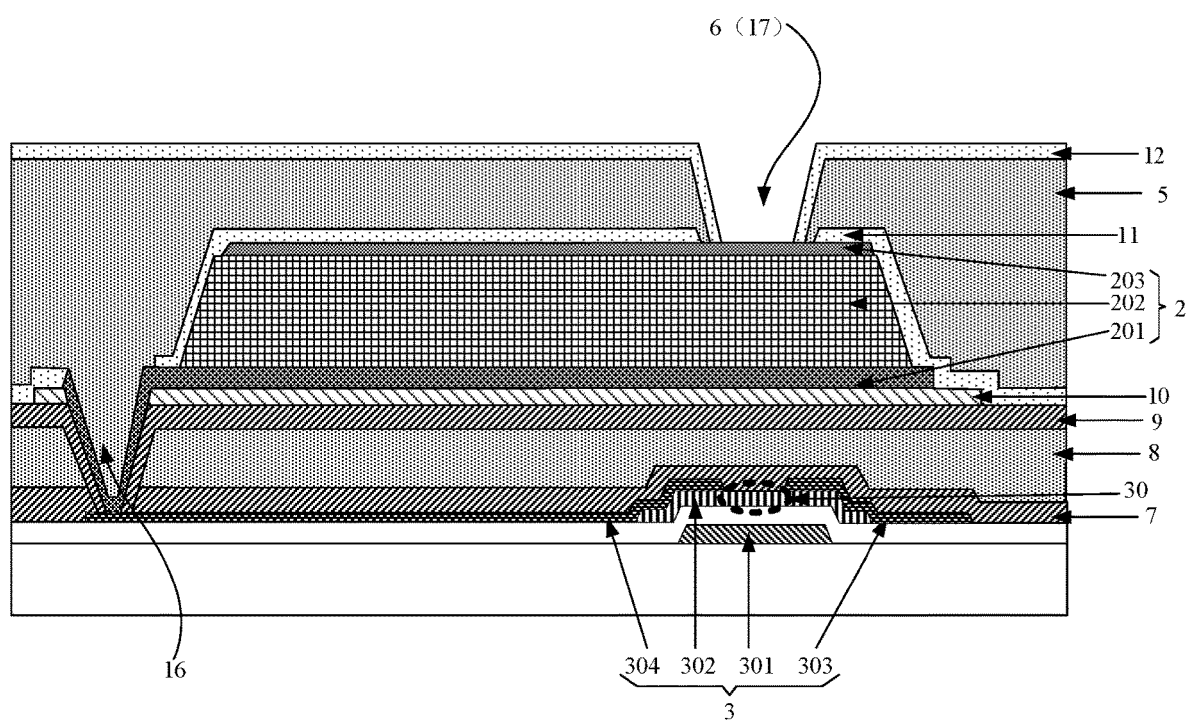

Referring to FIG. 18e, the buffer layer 11, the second organic layer 5 and the fourth passivation layer 12 are formed therein with a first via hole 6, and at least part of an orthographic projection of the channel region 30 on the base substrate 1 is located within an orthographic projection of the first via hole 6 on the base substrate 1. The first via hole 6 may also be used as a via hole for subsequently connecting the bias voltage line 4 to the conductive electrode 203 in the photoelectric conversion part 2 (i.e., as described in the foregoing embodiment, the first via hole 6 and the third via hole 17 may be a same via hole).

At step S306, forming a bias voltage line on a side of the fourth passivation layer away from the base substrate.

Figure 18F:
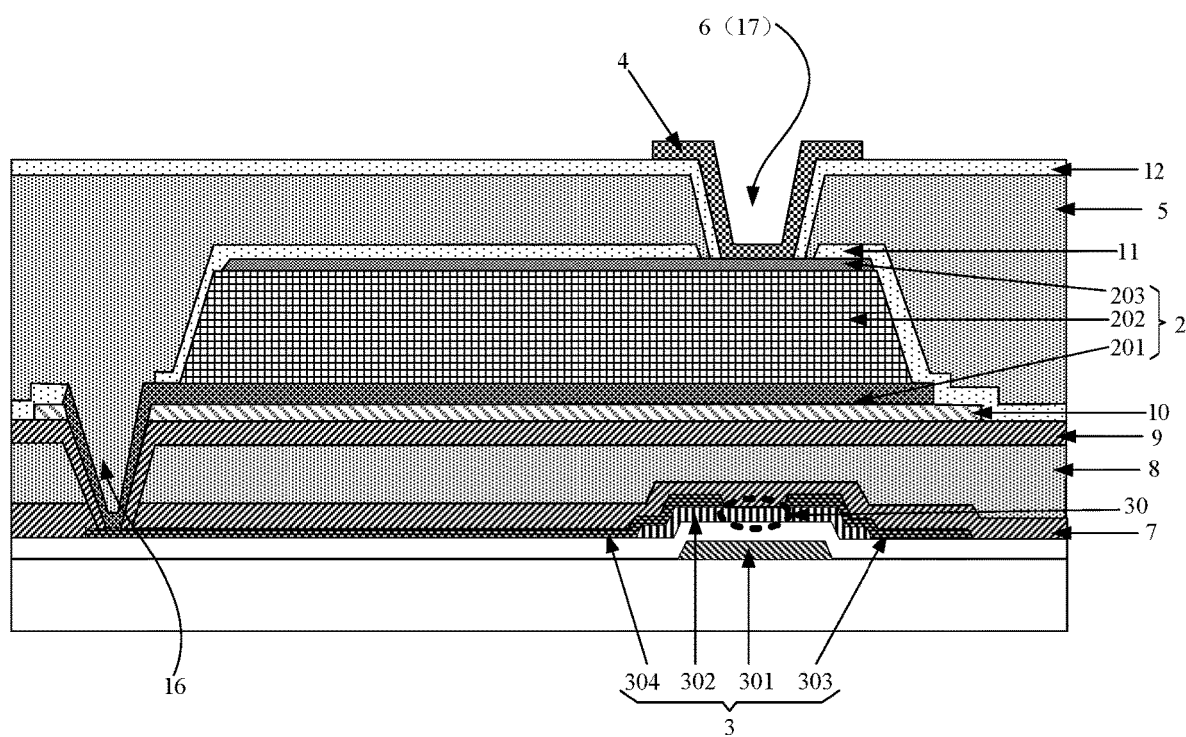

Referring to FIG. 18f, the bias voltage line 4 is connected to the conductive electrode 203 corresponding thereto through the first via hole 6 (also referred to as the third via hole 17) corresponding thereto.

It should be noted that, in some implementations, an orthographic projection of the bias voltage line 4 on the base substrate 1 completely covers the orthographic projection of the channel region 30 on the base substrate 1.

At step S307, sequentially forming a fifth passivation layer and a third organic layer on a side of the bias voltage line away from the base substrate.

Referring to FIG. 12, the five passivation layers 13 and the third organic layer 14 may encapsulate the detection substrate.

It should be understood that the above embodiments are merely exemplary embodiments employed to illustrate the principles of the present disclosure, and the present disclosure is not limited thereto. It will be apparent to those skilled in the art that various changes and modifications may be made therein without departing from the spirit and scope of the present disclosure, and these changes and modifications are considered to be within the scope of the present disclosure.

What is claimed is:

1. A detection substrate, comprising: a base substrate, a plurality of detection pixel units arranged in an array on the base substrate, wherein each detection pixel unit comprises:
a thin film transistor and a photoelectric conversion part located on a side, away from the base substrate, of the thin film transistor, and a bias voltage line is arranged on a side, away from the base substrate, of the photoelectric conversion part;
the thin film transistor comprises: an active layer, a first electrode and a second electrode, both the first electrode and the second electrode being electrically connected to the active layer, and the active layer comprising a channel region;
an end of the photoelectric conversion part close to the base substrate is electrically connected with the second electrode, and another end of the photoelectric conversion part away from the base substrate is electrically connected with the bias voltage line corresponding thereto;
at least one dielectric layer is provided between the photoelectric conversion part and the bias voltage line, the dielectric layer is formed with a first via hole therein, and at least part of an orthographic projection of the channel region on the base substrate is located within an orthographic projection of the first via hole on the base substrate.

2. The detection substrate of claim 1, wherein the at least one dielectric layer comprises:
a second organic layer;
a buffer layer located between the second organic layer and the photoelectric conversion part; and/or
a fourth passivation layer located between the second organic layer and the bias voltage line.

3. The detection substrate of claim 1, wherein a third via hole communicating to an end of the photoelectric conversion part away from the base substrate is formed in the dielectric layer, and the bias voltage line is in contact with the end of the photoelectric conversion part, corresponding to the bias voltage line, away from the base substrate through the third via hole corresponding to the bias voltage line.

4. The detection substrate of claim 3, wherein the orthographic projection of the channel region on the base substrate and an orthographic projection of the photoelectric conversion part on the base substrate are not overlapped with each other.

5. The detection substrate of claim 4, wherein the photoelectric conversion part comprises a reading electrode and a photoelectric conversion structure, the photoelectric conversion structure being located on a side of the reading electrode away from the base substrate, a material of the reading electrode comprising a metal material;
an orthographic projection of a layer structure where the reading electrode is located on the base substrate is not overlapped with the orthographic projection of the channel region on the base substrate.

6. The detection substrate of claim 4, wherein the orthographic projection of the channel region on the base substrate is located within an orthographic projection of the bias voltage line on the base substrate, a material of the bias voltage line comprising a metal material.

7. The detection substrate of claim 3, wherein the orthographic projection of the channel region on the base substrate is located within an orthographic projection of the photoelectric conversion part on the base substrate,
the first via hole and the third via hole are a same via hole, and
a material of the bias voltage line comprises a transparent conductive material.

8. The detection substrate of claim 3, wherein the detection pixel unit further comprises:
a sacrificial layer located between the thin film transistor and the photoelectric conversion part, a material of the sacrificial layer comprising an oxide;
at least part of the orthographic projection of the channel region on the base substrate is located within an orthographic projection of the sacrificial layer on the base substrate.

9. The detection substrate of claim 8, wherein the sacrificial layer is in contact with an end of the photoelectric conversion part close to the base substrate, and sacrificial layers in different detection pixel units are insulated from each other,
wherein the orthographic projection of the channel region on the base substrate and an orthographic a projection of the photoelectric conversion part on the base substrate are not overlapped with each other;
a third passivation layer is provided between the sacrificial layer and the bias voltage line; and
the orthographic projection of the first via hole on the base substrate is located within an orthographic projection of the third passivation layer on the base substrate, and
wherein the at least one dielectric layer comprises a second organic layer, a buffer layer and a fourth passivation layer;

a compactness of the third passivation layer is smaller than that of the buffer layer, and the compactness of the third passivation layer is smaller than that of the fourth passivation layer, and a material of the third passivation layer comprises silicon oxide, a material of the buffer layer comprises silicon nitride, and a material of the fourth passivation layer comprises silicon nitride.

10. The detection substrate of claim 8, wherein a first passivation layer, a first organic layer, and a second passivation layer are further provided between the thin film transistor and the photoelectric conversion part, the first organic layer being located on a side of the first passivation layer away from the base substrate, the second passivation layer being located on a side of the first organic layer away from the base substrate;

the sacrificial layer is located between the second passivation layer and the photoelectric conversion part.

11. The detection substrate of claim 10, wherein the first passivation layer, the first organic layer and the second passivation layer are formed therein with a second via hole, communicating to the second electrode;

the photoelectric conversion part comprises a reading electrode and a photoelectric conversion structure, and the photoelectric conversion structure being located on a side of the reading electrode away from the base substrate;

the reading electrode is in contact with the second electrode through the second via hole, and the sacrificial layer is not in contact with the second electrode, and wherein the orthographic projection of the sacrificial layer on the base substrate and an orthographic projection of the second via hole on the base substrate are not overlapped with each other or are partially overlapped with each other, and/or at least part of a boundary of an orthographic projection of the reading electrode on the base substrate is located within a boundary of the orthographic projection of the sacrificial layer on the base substrate, and/or an orthographic projection of the photoelectric conversion structure on the base substrate is not overlapped with the orthographic projection of the second via hole on the base substrate, and/or a boundary of an orthographic protection of the photoelectric conversion structure on the base substrate is located within a boundary of an orthographic projection of the reading electrode on the base substrate.

12. The detection substrate of claim 10, wherein a material of the first passivation layer comprises silicon oxide and a material of the second passivation layer comprises silicon oxide.

13. The detection substrate of claim 8, wherein a first passivation layer, a first organic layer and a second passivation layer are further provided between the thin film transistor and the photoelectric conversion part, the first organic layer being located on a side of the first passivation layer away from the base substrate, and the second passivation layer being located on a side of the first organic layer away from the base substrate;

the sacrificial layer is located between the first passivation layer and the first organic layer;

or, the sacrificial layer is located between the first organic layer and the second passivation layer.

14. The detection substrate of claim 8, wherein the orthographic projection of the channel region on the base substrate is located within the orthographic projection of the sacrificial layer on the base substrate.

15. The detection substrate of claim 1, further comprising: a plurality of gate lines arranged in a first direction and a plurality of signal reading lines arranged in a second direction, the gate lines each extending in the second direction, the signal reading lines each extending in the first direction;

the thin film transistor further comprises a gate electrode which is electrically connected with one of the gate lines corresponding thereto;

the second electrode of the thin film transistor is electrically connected to one of the signal reading lines corresponding thereto.

16. The detection substrate of claim 15, wherein each detection pixel unit comprises a sacrificial layer, an orthographic projection of the sacrificial layer on the base substrate is not overlapped with an orthographic projection of the gate line on the base substrate, and the orthographic projection of the sacrificial layer on the base substrate is not overlapped with an orthographic projection of the signal reading line on the base substrate, and wherein the sacrificial layer comprises: a first portion and a second portion which are connected with each other, a part of the first portion close to the gate line or the signal reading line protruding from the second portion;

a line width of a part of the signal reading line close to the first portion is smaller than a line width of a part of the signal reading line close to the second portion, and a line width of a part of the gate line close to the first portion is smaller than a line width of a part of the gate line close to the second portion.

17. The detection substrate of claim 15, wherein the second electrode comprises: a first conductive portion for connecting with the active layer, a second conductive portion for connecting with an end, close to the base substrate, of the photoelectric conversion part, and a third conductive portion connecting the first conductive portion with the second conductive portion, wherein the third conductive portion is located between the first conductive portion and the second conductive portion;

a side edge of the first conductive portion away from the gate line and a side edge of the second conductive portion away from the gate line each extend along the second direction;

a distance from the side edge of the first conductive portion away from the gate line to the gate line is larger than a distance from the side edge of the second conductive portion away from the gate line to the gate line, and wherein the third conductive portion comprises: a first connecting part connected to the first conductive portion, a second connecting part connected to the second conductive portion, and a third connecting part connecting the first connecting part with the second connecting part, the third connecting part being located between the first connecting part and the second connecting part;

the first connecting part extends along the second direction, and a side edge of the first connecting t away from the gate line and the side edge of the first conductive portion, which is connected to the first connecting part, away from the gate line, are located on a same straight line;

the second connecting part extends along the second direction, and a side edge of the second connecting part away from the gate line and the side edge of the second conductive portion, which is connected with the second connecting part, away from the gate line, are located on a same straight line;

a direction in which the third connecting part extends intersects with the second direction.

18. The detection substrate of claim 15, wherein the gate electrode comprises: a body portion and a fourth connecting part connected with the body portion, the fourth connecting part being in contact with the gate line corresponding thereto;
- a width of the fourth connecting part in the second direction is larger than a width of the body portion in the second direction, and
- wherein a width of the fourth connecting part in the second direction gradually decreases in a direction from the fourth connecting part towards the body portion.

19. The detection substrate of claim 1, further comprising:
- a fifth passivation layer located on a side of the bias voltage line away from the base substrate; and
- a third organic layer located on a side of the fifth passivation layer away from the base substrate.

20. A flat panel detector, comprising the detection substrate of claim 1.

* * * * *